(12) United States Patent
Chang et al.

(10) Patent No.: US 11,127,651 B2
(45) Date of Patent: *Sep. 21, 2021

(54) HIGH POWER MODULE SEMICONDUCTOR PACKAGE WITH MULTIPLE SUBMODULES

(71) Applicant: SEMICONDUCTOR COMPONENTS INDUSTRIES, LLC, Phoenix, AZ (US)

(72) Inventors: Jie Chang, Suzhou (CN); HuiBin Chen, Suzhou (CN); Keunhyuk Lee, Suzhou (CN); Jerome Tysseyre, Scottsdale, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/732,192

(22) Filed: Dec. 31, 2019

(65) Prior Publication Data

US 2020/0194336 A1 Jun. 18, 2020

Related U.S. Application Data

(63) Continuation of application No. 15/874,355, filed on Jan. 18, 2018, now Pat. No. 10,553,517.

(51) Int. Cl.
*H01L 23/473* (2006.01)
*H01L 23/367* (2006.01)
(Continued)

(52) U.S. Cl.
CPC ...... *H01L 23/3675* (2013.01); *H01L 23/3114* (2013.01); *H01L 23/3735* (2013.01);
(Continued)

(58) Field of Classification Search
CPC ....... H01L 23/40–4093; H01L 21/4871–4882; H01L 23/467; H01L 23/473–4735;
(Continued)

(56) References Cited

U.S. PATENT DOCUMENTS 5,543,740 A 8/1996 Wong
5,920,120 A * 7/1999 Webb .................. H01L 23/4093
257/718

(Continued)

*Primary Examiner* — Jarrett J Stark
(74) *Attorney, Agent, or Firm* — Brake Hughes Bellermann LLP

(57) ABSTRACT

In one general aspect, a package can include a first submodule including a first semiconductor die coupled to a first substrate and a first spacer, and disposed between the first spacer and the first substrate. The first submodule includes a second spacer disposed lateral to the first semiconductor die. The package includes a second submodule including a second semiconductor die coupled to a second substrate and a third spacer, and disposed between the third spacer and the second substrate. The second submodule includes a fourth spacer disposed lateral to the second semiconductor die. The package includes an inter-module layer disposed between the first submodule and the second submodule. The first spacer of the first submodule is electrically coupled to the fourth spacer of the second-submodule via the inter-module layer. The second spacer of the first submodule is electrically coupled to the third spacer of the second-submodule via the inter-module layer.

17 Claims, 22 Drawing Sheets

(51) Int. Cl.
*H01L 23/31* (2006.01)
*H01L 23/373* (2006.01)
*H01L 23/00* (2006.01)
*H01L 25/18* (2006.01)
*H01L 25/11* (2006.01)
*H01L 25/00* (2006.01)
*H01L 23/433* (2006.01)
*H01L 23/495* (2006.01)
*H02M 7/5387* (2007.01)
*H02M 7/00* (2006.01)

(52) U.S. Cl.
CPC ........ *H01L 23/4334* (2013.01); *H01L 23/473* (2013.01); *H01L 23/49551* (2013.01); *H01L 24/32* (2013.01); *H01L 25/117* (2013.01); *H01L 25/18* (2013.01); *H01L 25/50* (2013.01); H01L 23/3107 (2013.01); H01L 23/49537 (2013.01); H01L 23/49568 (2013.01); H01L 23/49575 (2013.01); H01L 2224/32225 (2013.01); H01L 2924/10272 (2013.01); H01L 2924/1203 (2013.01); H01L 2924/13055 (2013.01); H01L 2924/14252 (2013.01); H02M 7/003 (2013.01); H02M 7/5387 (2013.01)

(58) Field of Classification Search
CPC . H01L 23/44–445; H01L 23/373–3738; H01L 23/367–3677; H01L 23/36–3738; H01L 23/538–5389; H01L 25/117; H01L 25/0756; H01L 25/074; H01L 25/0657; H01L 25/043; H01L 27/0248–0296
See application file for complete search history.

(56) References Cited

U.S. PATENT DOCUMENTS

| | | | |
|---|---|---|---|
| 5,990,550 A * | 11/1999 | Umezawa | H01L 23/367 257/697 |
| 6,323,549 B1 | 11/2001 | Farmer et al. | |
| 7,047,637 B2 | 5/2006 | Farmer et al. | |
| 7,068,097 B2 | 6/2006 | Atmur et al. | |
| 7,227,198 B2 | 6/2007 | Cerezo et al. | |
| 7,301,235 B2 | 11/2007 | Hu et al. | |
| 7,425,757 B2 | 9/2008 | Takubo et al. | |
| 7,492,043 B2 | 2/2009 | Noquil et al. | |
| 7,675,148 B2 | 3/2010 | Choi et al. | |
| 7,736,397 B2 | 6/2010 | Chung et al. | |
| 8,198,139 B2 | 6/2012 | Yang | |
| 8,377,725 B2 * | 2/2013 | Fujitomo | H01L 33/52 438/26 |
| 8,537,550 B2 * | 9/2013 | Higuchi | H01L 23/473 361/699 |
| 8,604,611 B2 | 12/2013 | Hauenstein et al. | |
| 9,059,145 B2 * | 6/2015 | Kadoguchi | H01L 23/4334 |
| 9,892,990 B1 * | 2/2018 | Galloway | H01L 24/81 |
| 2001/0045644 A1 * | 11/2001 | Huang | H01L 23/49575 257/718 |
| 2006/0027921 A1 * | 2/2006 | Chiu | H01L 23/562 257/738 |
| 2008/0023807 A1 | 1/2008 | Noquil et al. | |
| 2009/0057865 A1 * | 3/2009 | Brodsky | H01L 23/4006 257/687 |
| 2011/0260314 A1 | 10/2011 | Minotti et al. | |
| 2013/0099364 A1 | 4/2013 | Liu et al. | |
| 2016/0358838 A1 * | 12/2016 | Basler | H01L 23/3737 |
| 2018/0049311 A1 | 2/2018 | Hoang et al. | |
| 2018/0061807 A1 | 3/2018 | Lee | |

* cited by examiner

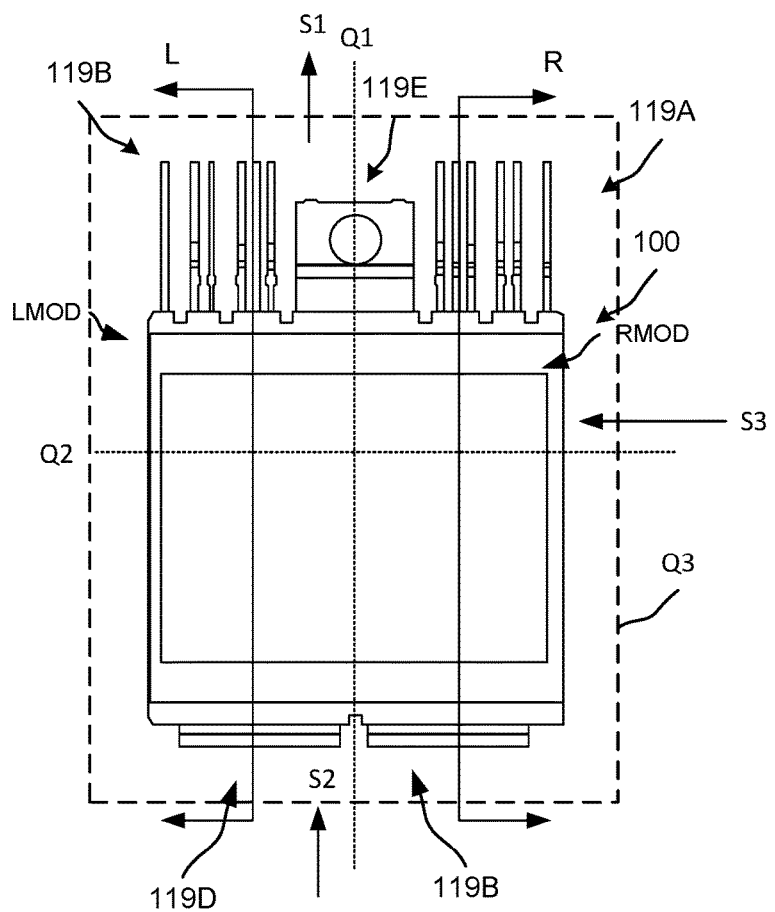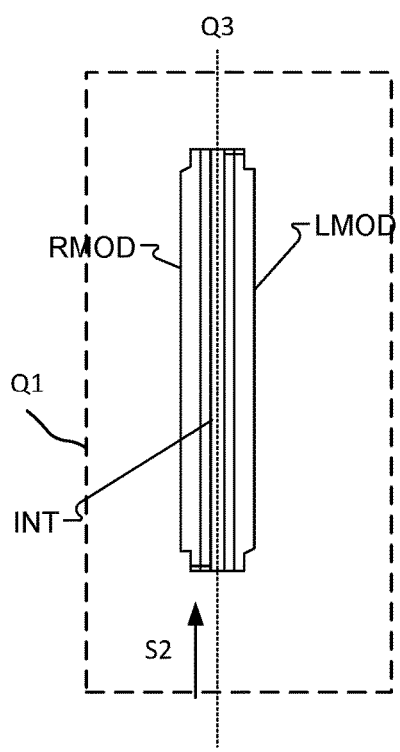
FIG. 1A
FIG. 1B

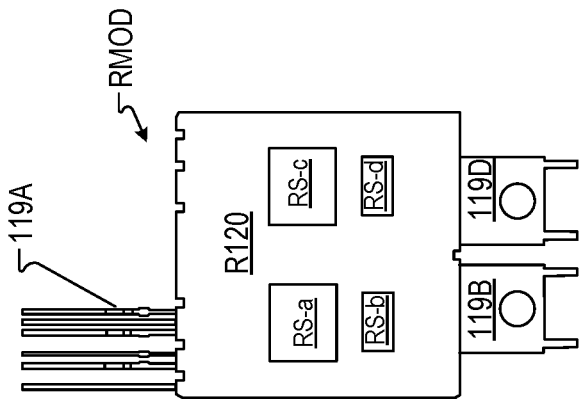
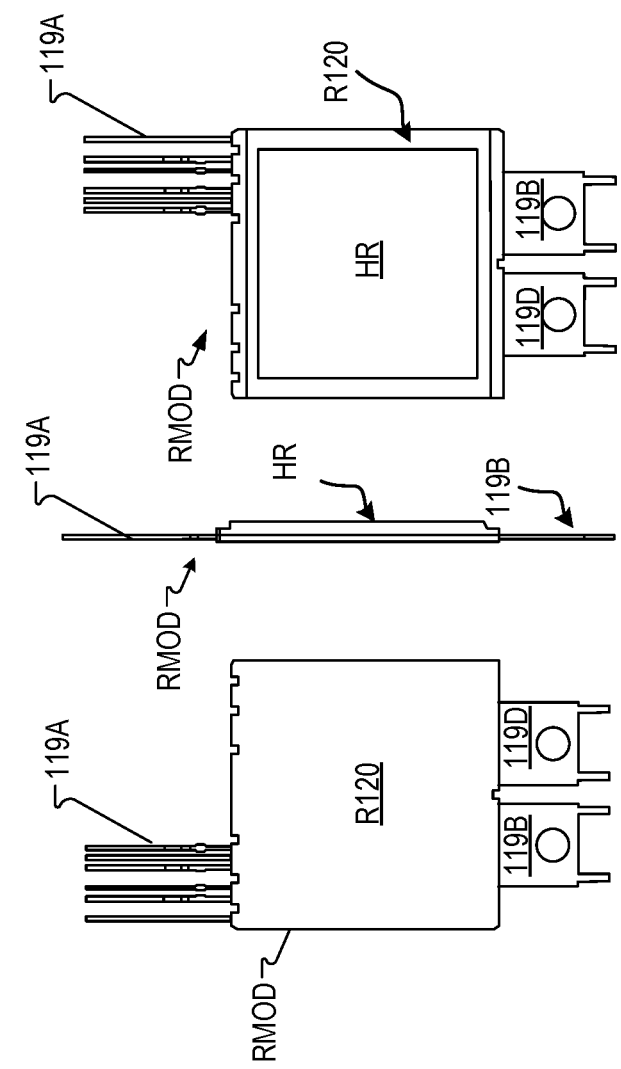

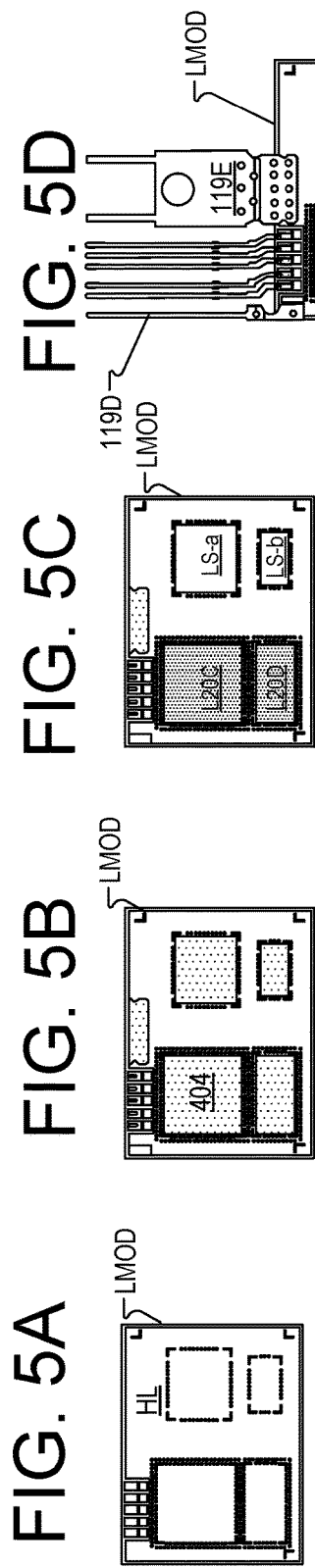

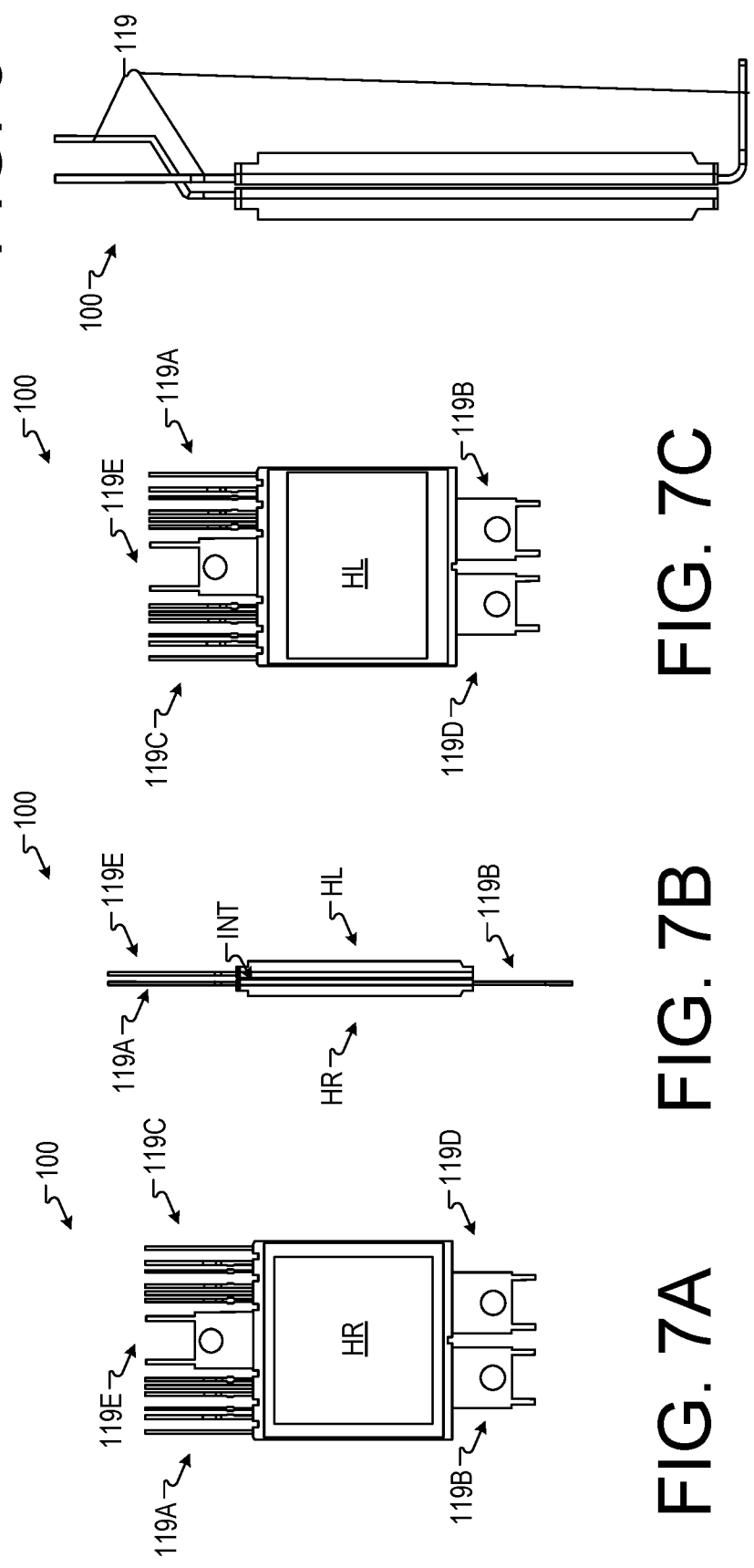

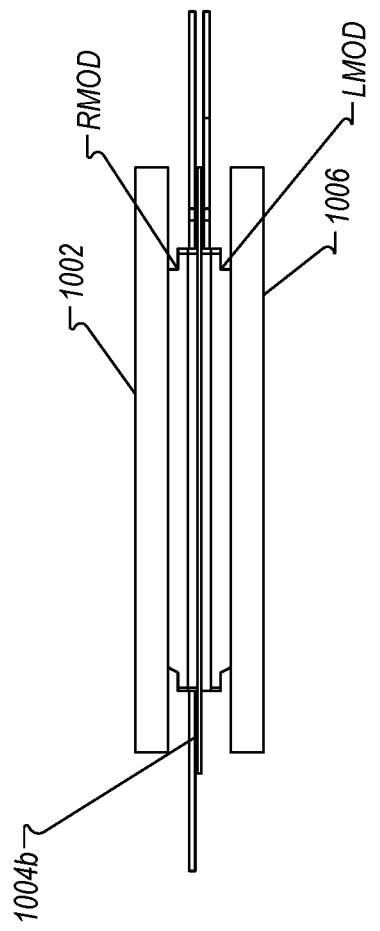
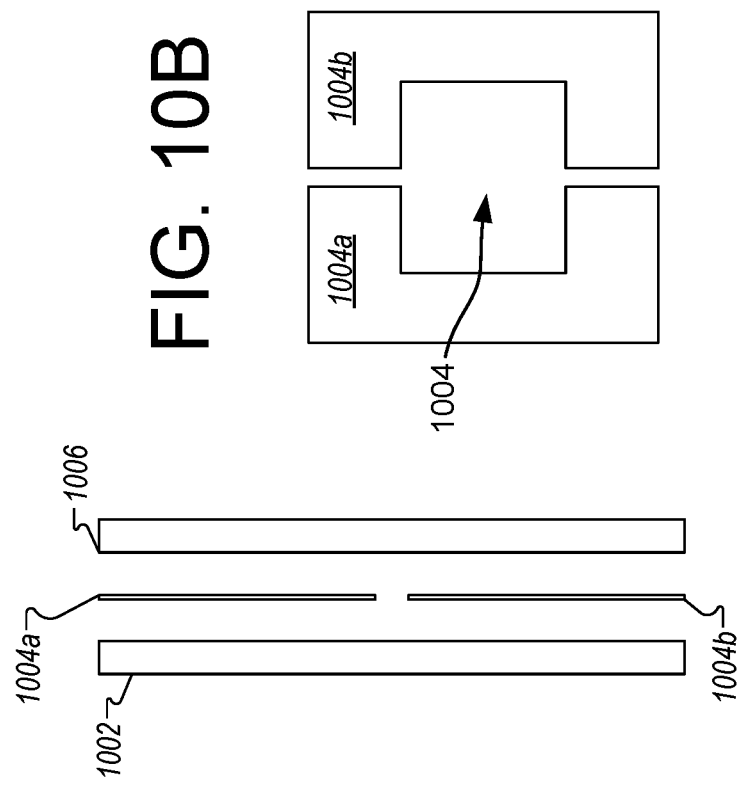
FIG. 10C
FIG. 10B
FIG. 10A

US 11,127,651 B2

HIGH POWER MODULE SEMICONDUCTOR PACKAGE WITH MULTIPLE SUBMODULES

RELATED APPLICATION

This application is a continuation application of U.S. patent application Ser. No. 15/874,355, filed on Jan. 18, 2018, the disclosure of which is incorporated by reference herein in its entirety.

TECHNICAL FIELD

This description relates to high power modules with multiple submodules.

BACKGROUND

It may be desirable in some applications to engineer and manufacture power devices to provide sufficient performance, cost, and reliability. One such application can include hybrid and electric vehicle applications. Semiconductor power devices are often manufactured discretely as opposed to being integrated in an integrated circuit (IC) process. is typical with power devices, thermal performance may dictate failure rates when components are heated above certain temperatures. Thus, a need exists for systems, methods, and apparatus to address the shortfalls of present technology and to provide other new and innovative features.

SUMMARY

In one general aspect, a package can include a first submodule including a first semiconductor die coupled to a first substrate and a first spacer, and disposed between the first spacer and the first substrate. The first submodule includes a second spacer disposed lateral to the first semiconductor die. The package includes a second submodule including a second semiconductor die coupled to a second substrate and a third spacer, and disposed between the third spacer and the second substrate. The second submodule includes a fourth spacer disposed lateral to the second semiconductor die. The package includes an inter-module layer disposed between the first submodule and the second submodule. The first spacer of the first submodule is electrically coupled to the fourth spacer of the second-submodule via the inter-module layer. The second spacer of the first submodule is electrically coupled to the third spacer of the second-submodule via the inter-module layer.

BRIEF DESCRIPTION OF THE DRAWINGS

FIG. 1A is a diagram that illustrates a plan view of a package including at least two submodules that provide dual-sided cooling, according to an example embodiment.

FIG. 1B is a diagram that illustrates a side view of a portion of the package shown in FIG. 1A.

FIGS. 2A through 2F are diagrams that illustrate various views of a submodule of the package shown in FIG. 1A.

FIGS. 4A through 4K are diagrams that illustrate a method of manufacturing at least a portion of the packages described herein.

FIGS. 5A through 5K are diagrams that illustrate a method of manufacturing at least a portion of the submodules described herein.

FIGS. 7A through 7C illustrate various views of a package after submodules have been coupled.

FIG. 8 is a diagram that illustrates a side view of a package with leads.

FIGS. 10A through 10C are diagrams that illustrate a tool used to manufacture the final assembly described in connection with at least FIG. 6 and FIG. 9C.

DETAILED DESCRIPTION

Figure 1C:
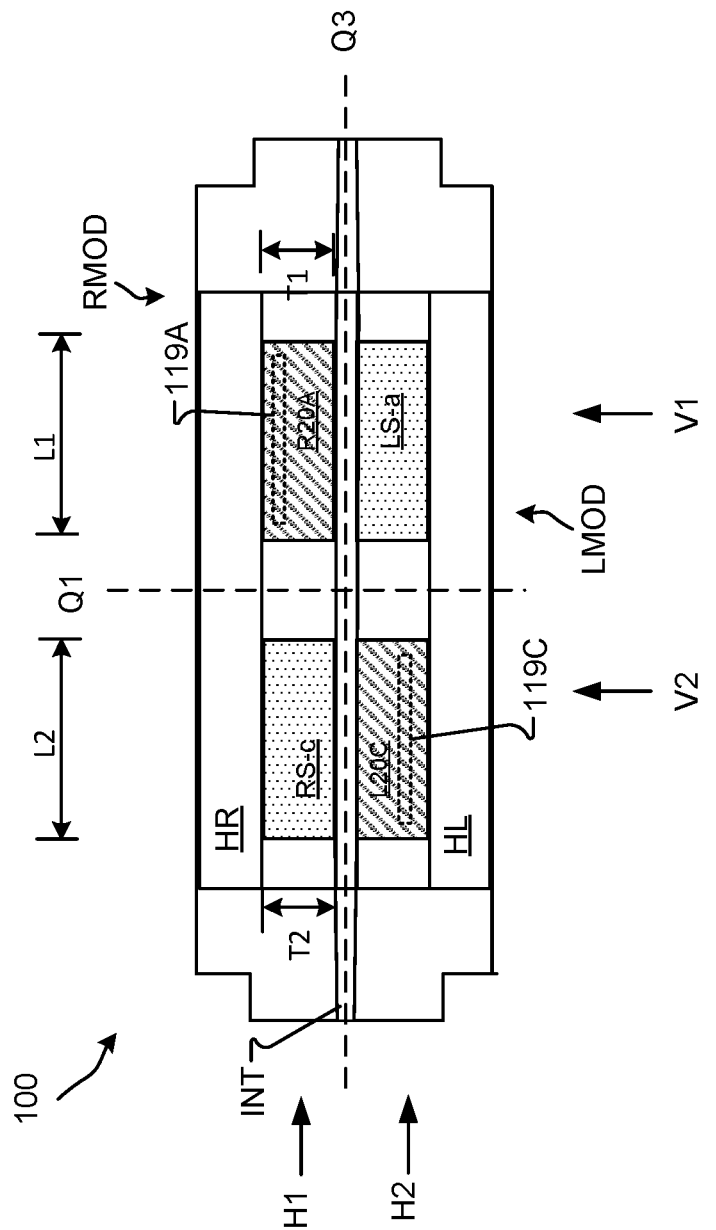
FIGS. 1C through 1D are diagrams that illustrate various cross-sectional views of components of the submodules of FIG. 1A, according to an example embodiment.

In some implementations, the submodules and packages described herein include high power devices that are assembled together into a single package. For example, a submodule can include multiple semiconductor die (e.g., silicon semiconductor die, silicon carbide (SiC) semiconductor die, insulated-gate bipolar transistors (IGBTs), metal-oxide-semiconductor field effect transistor (MOSFET) die, etc.) that may be assembled together to provide high performance, reliability, and/or improvement in thermal management while maintaining proper electrical performance of the submodule. In some implementations, the packages described herein may include one or more inter-module layers that can be disposed between the submodules to provide thermal cooling effects for two or more submodules when joined together. Accordingly, the inter-module layer can be a common cooling substrate disposed between the submodules. Such inter-module layers (and the material included therein) can be used as part of dual-sided cooling of the submodules and cooling of components that make up the submodules. In some implementations, submodules can be thermally coupled and/or electrically coupled via an inter-module layer. In some implementations, submodules can be thermally isolated and/or electrically isolated via an inter-module layer.

In some implementations, the manufacturing processes described herein may allow submodules to be generated, quality-assessed, cleaned, and/or partially tested before combining the submodules into a package, for example. In some implementations, the quality of the package may be improved using the manufacturing processes described herein because such processes may ensure uniform package thickness and cooling of individual submodules before assembling the submodules into the final device package (e.g., assembly).

In some implementations, the packages described herein may be composited packages (e.g., a combined package made from two or more submodules). The composited packages may include high power (e.g., automotive high power module (AHPM)) modules in the form of a first (left-side) submodule part and a second (right-side) submodule. Such submodules can be molded and grinded away (and otherwise processed) separately before being joined by, for example, press-type silver sintering. The separate processes (for each of the separate submodules) improve ease of handling the submodules before generating a package when the submodules are joined together.

In some implementations, the composited packages may generate a sandwich package (i.e., two or more submodules stacked in one package) with multiple components (e.g., die, spacer, substrate, solder, etc.) that may be used to create a stack having a wider tolerance for package thickness dimensions. For example, one or more of the submodules described herein may have a thickness of in the range of approximately 1.5 to 3 mm, the entire package thickness can be in the range of approximately 4.0 to 7 mm.

The two-in-one package (e.g., the sandwich package) (also referred to as a multi-submodule package) may provide the advantage of a wider tolerance than a single module generated without splitting submodules across the package. The dual submodule package may decrease package warpage and/or provide for a variable morphology without affecting operation of such assembled devices. In some implementations, the multi-submodule package may provide a wider grinding range on one or more spacers within the submodule devices to allow for additional grinding to satisfy package tolerances. Spacer included within submodules can be referred to as submodule spacers. Spacers included between submodules can be referred to as inter-module spacers.

In some implementations, the multi-submodule package described herein may provide for improved monitoring of device failure because devices can be partially tested before being assembled into a final device package. In some implementations, the multi-submodule package may also enable earlier cleaning of, for example, gaps between components to ensure wire bonding quality is maintained. In some implementations, the multi-submodule package can simplify process challenges for detecting short circuit events that may cause damage to water jacket packages used for cooling components.

In some implementations, the submodules (and final package including the submodules) described herein can be used in applications with high voltages (e.g., higher than 600 V), high current densities (e.g., between 100 A to 800 A (e.g., 400 A)), and/or high switching frequencies (e.g., greater than 1 kHz). In some implementations, the submodules described herein can be, or can include, multichip common gate/source down low profile packages.

The submodules can be included in a variety of applications including, for example, high power device applications (e.g., high power applications greater than 600 V (especially when using silicon carbide die), high power applications greater than 400 V (e.g., when using silicon die)). In some implementations, the modules can be included in a variety of applications including, for example, automotive applications (e.g., automotive high power module (AHPM), electrical vehicles, hybrid electrical vehicles), computer applications, industrial equipment, traction invertors, on-board charging applications, inverter applications, and/or so forth. In some implementations, one or more of the semiconductor die described herein can include, or can be, at least a portion of an automotive high power module (AHPM) power device.

FIG. 1A is a diagram that illustrates a plan view of a package 100 including at least two submodules that have dual-sided cooling, according to an example embodiment. Specifically, the package 100 includes a first submodule LMOD (shown on bottom) and a second submodule RMOD (shown on top). Although illustrated as including two submodules, in some implementations, the package 100 can include additional submodules.

Although not shown in FIG. 1A or 1B, each of the submodules RMOD, LMOD of the package 100 can include one or more substrates. For example, in some implementations, the package 100 can be a dual cool submodule with a first substrate (not shown in FIG. 1A) on the first side of a semiconductor die (on submodule LMOD) and a second substrate (not shown in FIG. 1A) on a second side of the semiconductor die (on submodule RMOD). Additional details related to multiple substrates are described in connection with at least some of the figures below.

FIG. 1B is a diagram that illustrates a side view of a portion of the package 100 (without the leads) including at least two submodules RMOD, LMOD disposed within the package 100. The side view is from direction S3 of the packaged semiconductor device (e.g., package 100) of FIG. 1A. As shown in FIG. 1B, an inter-module layer INT is disposed between the submodule RMOD and the submodule LMOD and is aligned along plane Q3. The inter-module layer INT can be spacing (and the material disposed therein) that may be used to provide at a least a portion of the dual-sided cooling of the submodules RMOD, LMOD and cooling of components that make up the submodules RMOD, LMOD. The inter-module layer INT can have a thickness T7 (e.g., a vertical thickness). The inter-module layer INT can also be a mechanism through which components of the submodules RMOD, LMOD may be electrically connected (e.g., electrically coupled) or electrically insulated. The inter-module layer INT can be a cooling surface that is shared as a common cooling substrate between the submodules RMOD, LMOD. More details related to the dual-cooling are described below.

Figure 1D:
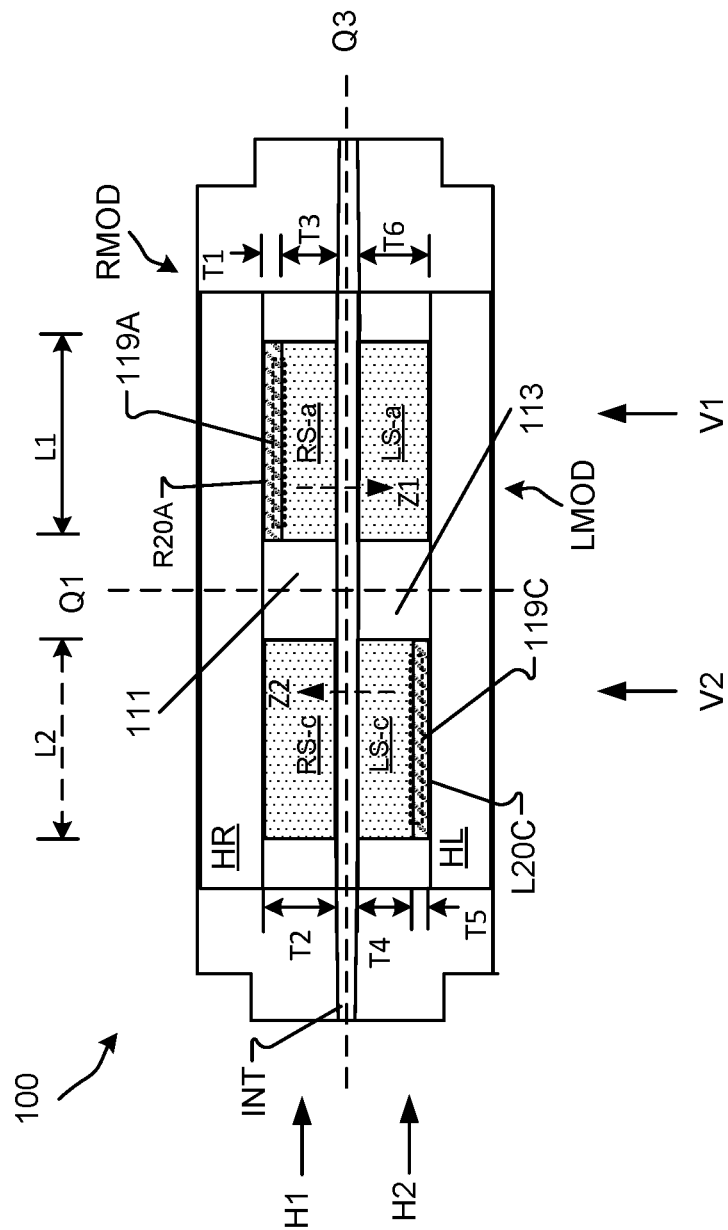

FIG. 1C is a diagram that illustrates a cross-sectional view of components of submodules RMOD, LMOD, according to an example embodiment. The dimensions in FIG. 1C are slightly exaggerated or skewed (relative to FIGS. 1A and 1B) to illustrate the principle elements of the package 100 more clearly. Specifically, some of the spacer elements are excluded, and some of the detail of some of the elements is not shown in FIG. 1C. FIG. 1D illustrates a more detailed view that includes some of the spacer elements that are not shown in FIG. 1C.

The submodule LMOD and submodule RMOD in FIG. 1C are shown along cut line Q2 (and are viewed along direction S2) shown in FIG. 1A. The submodule RMOD includes a substrate HR coupled to a semiconductor die R20A and a spacer RS-c. The semiconductor die R20A is electrically coupled to leads 119A (which can be part of a leadframe of the submodule RMOD) that extend from submodule RMOD (in the S1 direction, as shown in FIG. 1A).

The inter-module layer INT is disposed between submodule RMOD and submodule LMOD. The submodule LMOD includes a substrate HL coupled to a semiconductor die L20C and a spacer LS-a. The semiconductor die L20C is electrically coupled to leads 119C (which can be part of a leadframe of the submodule LMOD) that extend from submodule LMOD in the S1 direction, as shown in FIG. 1A. Although not shown, in some implementations, the leads for one of the submodules can extend in a different direction from the leads for another of the submodules. In some implementations, the first submodule RMOD can be a right-side submodule and the second submodule LMOD can be a left-side submodule. Leads 119B and 119C also extend from the package 100.

As shown in FIG. 1C, the semiconductor die R20A has a thickness T1 that is equal to a thickness T2 of the spacer RS-c. In some implementations, thickness T1 is larger or smaller than the thickness T2. Although not shown in FIG. 1C, the same thickness parameters can be applied to the components (e.g., semiconductor die and spacer) of the submodule LMOD.

In some implementations, the semiconductor die R20A has a length L1 that is the same as a length L2 of the spacer RS-a. In some implementations, the length L1 of the semiconductor die R20A is less than or greater than the length L2 of the spacer RS-c. Although not shown in FIG. 1C, the same length parameters can be applied to the components (e.g., semiconductor die and spacer) of the submodule LMOD.

As shown in FIG. 1C, the orientations of the semiconductor die and the spacers are defined within the submodules so that the semiconductor die in one submodule can be coupled to a spacer in another of the submodules. If oriented side-by-side, the submodules will be similar in manufacturing (which will be described in more detail below). For example, the spacer LS-a of submodule LMOD is coupled to semiconductor die R20A of the submodule RMOD via the inter-module layer INT. Similarly, the spacer RS-c of submodule RMOD is coupled to semiconductor die L20C of the submodule LMOD via the inter-module layer INT.

As shown in FIG. 1C, the submodule RMOD is disposed on side H1 (also can be referred to as the RMOD side) of the package 100 and the submodule LMOD is disposed on side H2 (also can be referred to as the LMOD side) of the package 100. The sides H1 and H2 are defined by bisecting the package along a planar direction (e.g., primary plane) of the package 100, which is the plane Q3 (which is aligned along the inter-module layer INT and is a horizontally-oriented plane). In some implementations, the inter-module layer INT can be used as an orientation feature instead of the plane Q3 because the inter-module layer INT is aligned along the plane Q3. Because the sides H1 and H2 are bisected by the plane Q3 (and the inter-module layer INT), which are horizontally oriented, the sides H1 and H2 can be referred to as horizontally-oriented (or planar-oriented) sides (e.g., horizontally-oriented side H1 and horizontally-oriented side H2).

The submodule RMOD is disposed on side H1 of the inter-module layer INT and the submodule LMOD is disposed on side H2 of inter-module layer INT. Accordingly, the submodule LMOD and the submodule RMOD are on opposite sides of the package 100.

The leads 119A that are associated with submodule RMOD and coupled to semiconductor die R20A are on side H1 of the inter-module layer INT, and the leads 119B that are associated with submodule LMOD and coupled semiconductor die 120A are on side H2 of the inter-module layer INT. Accordingly, the leads 119A and leads 119B are on opposite sides of the package 100.

As shown in FIG. 1C, the semiconductor die R20A is laterally disposed with respect to the spacer RS-c. Accordingly, the semiconductor die R20A and the spacer RS-c are aligned along the inter-module layer INT, but above the inter-module layer INT. Similarly, the semiconductor die R20A and the spacer RS-c are aligned along the inter-module layer INT, but above the inter-module layer INT.

As shown in FIG. 1C, the package 100 can be bisected along plane Q1, which is orthogonal to the inter-module layer INT and is a vertically-oriented plane (relative to the inter-module layer INT and plane Q3). The plane Q1 is aligned along the same direction as the leads 119A, 119C (which is the same direction as S1 shown in FIG. 1A). The plane Q1 is disposed between (e.g., bisects the submodule RMOD between) the semiconductor die R20A and the spacer RS-c. The plane Q1 is also disposed between (e.g., bisects the submodule LMOD between) the semiconductor die L20C and the spacer LS-a. The plane Q1 divides the module into sides V1 and V2. Because the sides V1 and V2 are bisected by the plane Q1, which are vertically oriented, the sides V1 and V2 can be referred to as vertically-oriented sides (e.g., vertically-oriented side V1 and vertically-oriented side V2).

As shown in FIG. 1C, the inter-module layer INT is disposed between the semiconductor die R20A and the spacer LS-a, and the inter-module layer INT is disposed between the semiconductor die L20C and the spacer RS-c. However, as shown in FIG. 1C, the orientation of the semiconductor die R20A and the spacer LS-a are flipped relative to that of the semiconductor die L20C and the spacer RS-c. Specifically, the vertical stack of the package 100 as oriented in from FIG. 1C from top to bottom on side V1 is substrate HR, semiconductor die R20A, inter-module layer INT, spacer LS-a, and substrate HL. The vertical stack of the package 100 as oriented in from FIG. 1C from top to bottom on side V2 is substrate HR, spacer RS-c, inter-module layer INT, semiconductor die L20C, and substrate HL. Thus, between substrate HL and substrate HR, the orientation of the semiconductor die and spacer about the inter-module layer INT on side V1 is opposite (or flipped) relative to the orientation of the semiconductor die and spacer about the inter-module layer INT on side V2.

Diagonally oriented quadrants include the same (or similar) elements and vertically oriented quadrants include different elements. For example, the quadrant V2-H2 includes the semiconductor die L20C, and the diagonally adjacent quadrant V1-H1 includes the semiconductor die R20A. The quadrant V2-H1 includes the spacer RS-c, and the diagonally adjacent quadrant V1-H2 includes the spacer LS-a. For example, the quadrant V2-H2 includes the semiconductor die L20C, and the vertically adjacent quadrant V2-H1 includes the spacer RS-c. The quadrant V1-H2 includes the spacer LS-a, and the vertically adjacent quadrant V1-H1 includes the semiconductor die R20A.

As shown in FIG. 1C, the inter-module layer INT can be, or can be part of, a dual-sided cooling element for both of the submodules LMOD, RMOD. For example, the submodule LMOD can include substrate HL for cooling on one side and inter-module layer INT for cooling on the other side. The submodule RMOD can include substrate HR for cooling on one side and inter-module layer INT for cooling on the other side. Accordingly, the inter-module layer INT can be a common layer for cooling for both of the submodules LMOD, RMOD.

In some implementations, the first substrate HL, the second substrate HR, and the inter-module layer INT are configured to provide thermal cooling to a number of components included in the submodule RMOD and the submodule LMOD. In some implementations, the inter-module layer INT may include at least one material to thermally cool the first submodule RMOD and the second submodule LMOD.

FIG. 1D is a diagram that illustrates a variation of the cross-sectional view of components of submodules LMOD, RMOD shown in FIG. 1C. The submodule LMOD and submodule RMOD are shown along cut along line Q2, shown in FIG. 1A. In this implementation, the quadrants including the semiconductor die R20A, L20C also include spacers. The semiconductor die R20A, L20C may be thinner than the spacers RS-c, LS-a, so spacers can be coupled to the semiconductor die R20A, L20C for consistency in thickness across the submodules LMOD, RMOD.

Specifically, as shown in FIG. 1D, the submodule RMOD includes the first semiconductor die R20A coupled to the first substrate HR and disposed between the spacer RS-a and the first substrate HR. The submodule RMOD also includes the spacer RS-c disposed lateral to the first semiconductor die R20A (and spacer RS-a) in a first module layer 111. Also, as shown in FIG. 1D, the second semiconductor die L20C is coupled to the second substrate HL and disposed between the spacer LS-c and the second substrate HL. In addition, the submodule LMOD includes the spacer LS-a disposed lateral to the second semiconductor die L20C in a second module layer 113.

In this implementation, the inter-module layer INT is disposed between (and can electrically couple) the spacer RS-a and the spacer LS-a. The inter-module layer INT is also disposed between (and can electrically couple) the spacer RS-c and the spacer LS-c.

As shown in FIG. 1D, the vertical stack on side V1 is flipped relative to the vertical stack on side V2. The orientation features described above in connection with FIG. 1C can be applied to FIG. 1D. Specifically, the vertical stack of the package 100 as oriented in from FIG. 1D from top to bottom on side V1 is substrate HR, semiconductor die R20A, spacer RS-a, inter-module layer INT, spacer LS-a, and substrate HL. The vertical stack as the package 100 as oriented in from FIG. 1C from top to bottom on side V2 is substrate HR, spacer RS-c, inter-module layer INT, spacer LS-c, semiconductor die L20C, and substrate HL. Thus, between substrate HL and substrate HR, the orientation of the semiconductor die and spacer about the inter-module layer INT on side V1 is opposite (or flipped) relative to the orientation of the semiconductor die and spacer about the inter-module layer INT on side V2.

As shown in FIG. 1D, the spacer RS-c has a thickness T2 that is equal to (e.g., substantially equal to) a combined thickness T1 of semiconductor die R20A and thickness T3 of spacer RS-a. Accordingly, a surface of the submodule RMOD in contact with the inter-module layer INT can be aligned (in a planar fashion) along the spacer RS-a and the spacer RS-c. Similarly, the spacer LS-a has a thickness T6 is equal to (e.g., substantially equal to) a combined thickness T5 of semiconductor die L20C and thickness T4 of spacer LS-c.

Figure 1F:
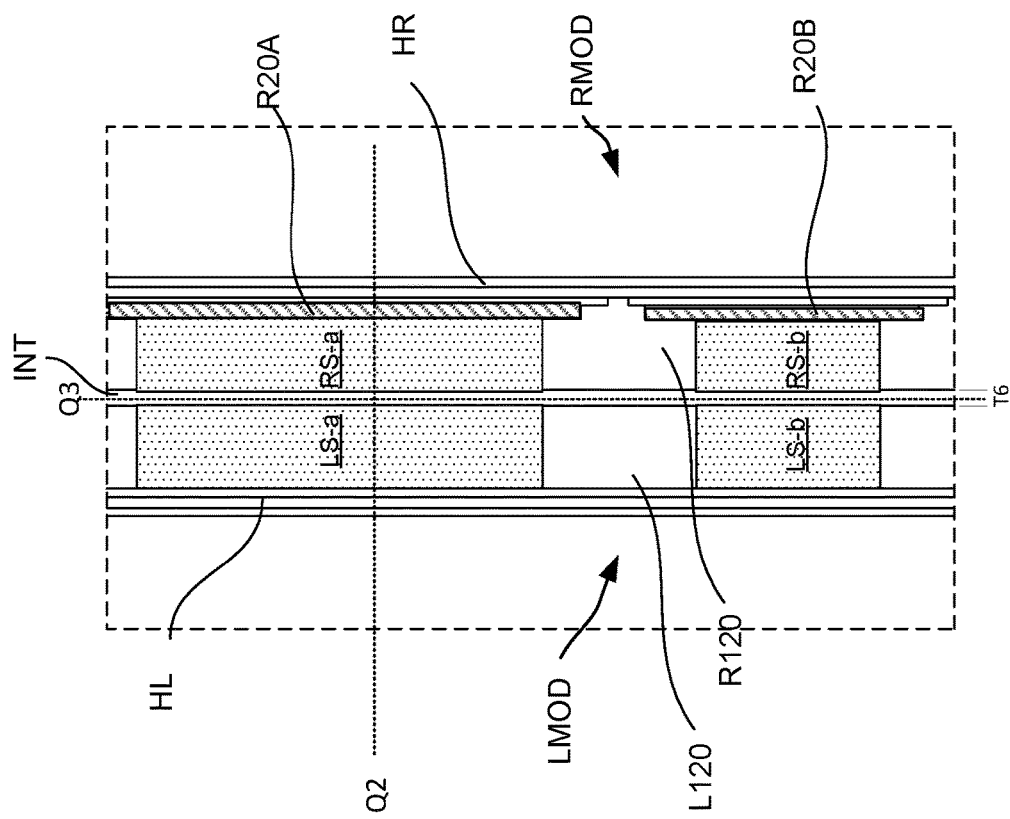
FIGS. 1E through 1H are diagrams that illustrate various cross-sectional views of components of the submodules of FIG. 1A.
Figure 1E:
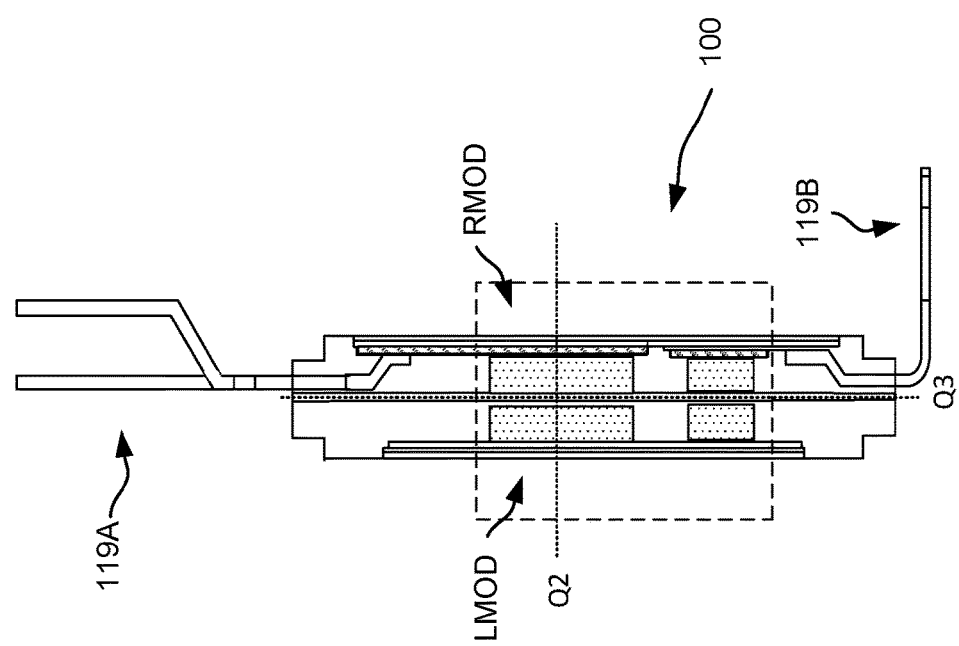

FIG. 1E is a side cross-sectional view of the package 100 cut along line R shown in FIG. 1A. As shown in FIG. 1E, leads 119A and 119B extend from the submodule RMOD and extend outside of (e.g., are exposed outside of) the package 100. The leads 119A and 119B are electrically coupled to the submodule RMOD (and/or other components disposed therein) via the substrate HR. The leads 119A extend out of one end (along the plane Q3) of the submodule RMOD and the lead 119B extends out of an opposite end (along the plane Q3) of the submodule RMOD.

FIG. 1F illustrates an example cross-sectional view of a zoomed in portion (shown with dashed lines) of the side-cross sectional view of the package 100 shown in FIG. 1E. As shown, the submodule RMOD includes the substrate HR. In this implementation, the substrate HR is coupled to a semiconductor die R20A (e.g., an insulated-gate bipolar transistor (IGBT) device) and semiconductor die R20B (e.g., a fast recovery diode (FRD)). The submodule RMOD (along this view) includes spacers RS-a and RS-b and the submodule LMOD includes spacers LS-a and LS-b. The spacer RS-a can be coupled to the spacer LS-a via a spacer (not shown) disposed in the inter-module layer INT so that the spacer RS-a can be electrically coupled to the spacer LS-a and the semiconductor die R20A. Similarly, the spacer RS-b can be coupled to the spacer LS-b via a spacer (not shown) disposed in the inter-module layer INT so that the spacer RS-b can be electrically coupled to the spacer LS-b and the semiconductor die R20B.

As shown in FIG. 1E at least a portion of each of the leads 119A are bent (at two deflection points) toward the RMOD side (away from the LMOD side) of the package 100. Also, the lead 119B is bent (at a 90 degree angle with one point of deflection) toward the RMOD side (away from the LMOD side) of the package 100. In some implementations, the lead forming type could be either straight or bent with different angles based on application board design.

Figure 1H:
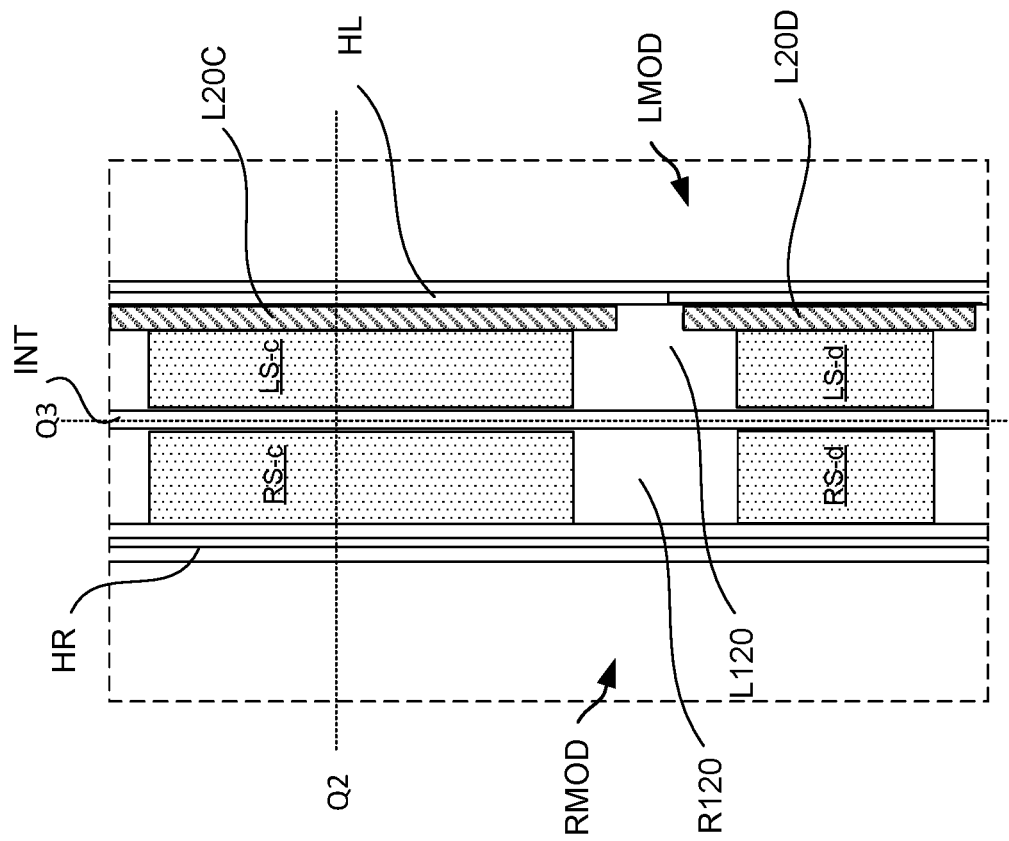
Figure 1G:
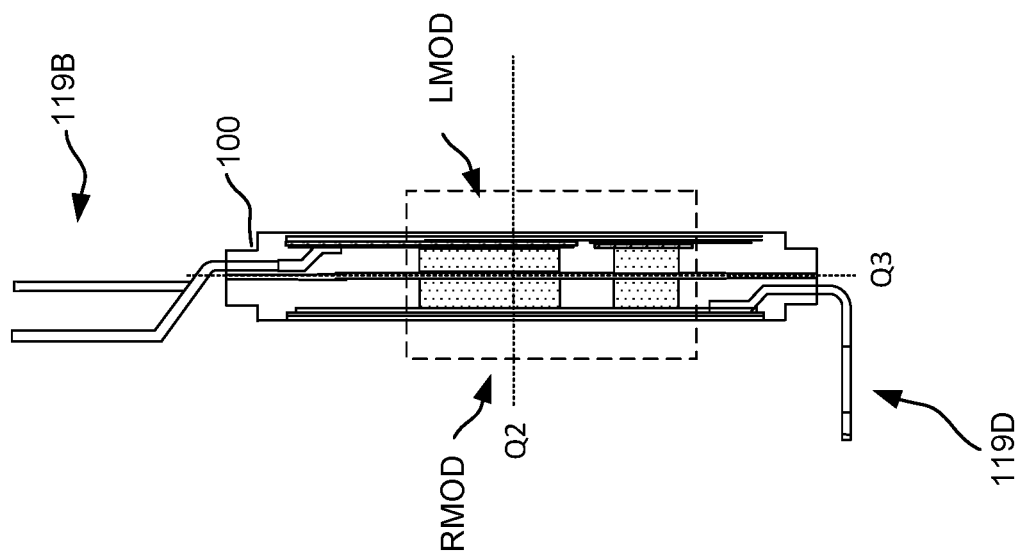

FIG. 1G is a side cross-sectional view of the package 100 cut along line L shown in FIG. 1A. As shown in FIG. 1E, leads 119B extend from the submodule LMOD and extend outside of (e.g., are exposed outside of) the package 100. The leads 119B are electrically coupled to the submodule LMOD (and/or other components disposed therein) via the substrate HL. The lead 119D extends from the submodule RMOD and extends outside of (e.g., is exposed outside of) the package 100. The lead 119D is electrically coupled to the submodule RMOD (and/or other components disposed therein) via the substrate HR. Leads 119B extend in one direction (along the plane Q3) from the submodule LMOD and lead 119D extends in an opposite direction (along the plane Q3) from the submodule RMOD.

FIG. 1H illustrates an example cross-sectional view of a zoomed in portion (shown with dashed lines) of the side-cross sectional view of the package 100 shown in FIG. 1G. As shown, the submodule LMOD includes the substrate HL. In this implementation, the substrate HL is coupled to a semiconductor die L20C (e.g., an insulated-gate bipolar transistor (IGBT) device) and semiconductor die L20D (e.g., a fast recovery diode (FRD)). The submodule RMOD (along this view) includes spacers RS-c and RS-d and the submodule LMOD includes spacers LS-c and LS-d. The spacer RS-c can be coupled to the spacer LS-c via a spacer (not shown) disposed in the inter-module layer INT so that the spacer RS-c can be electrically coupled to the spacer LS-c and the semiconductor die L20C. Similarly, the spacer RS-d can be coupled to the spacer LS-d via a spacer (not shown) disposed in the inter-module layer INT so that the spacer RS-d can be electrically coupled to the spacer LS-d and the semiconductor die L20D.

As shown in FIG. 1G, at least a portion of each of the leads 119B are bent (at two deflection points) toward the RMOD side (away from the LMOD side) of the package 100. Also, the lead 119D (which is coupled to the HR substrate of submodule RMOD) is bent (at a 90 degree angle with one point of deflection) toward the RMOD side (away from the LMOD side) of the package 100. In some implementations, the lead forming type could be either straight or bent with different angles based on application board design.

In some implementations, one or more diode semiconductor devices can be included in the submodule LMOD and/or RMOD. The diode semiconductor devices can be included in the package 100, for example, in situations where a body diode included in a transistor device of the semiconductor die is not sufficient for a particular circuit application. In some implementations, the package 100 can include multiple diode devices. In some implementations, the package 100 can include a 1:1 ratio of diode devices and transistor devices. In some implementations, the package 100 can include more or less than a 1:1 (e.g., 1:2, 2:1) ratio of diode devices and transistor devices.

In some implementations, the semiconductor die L20C, L20D shown in FIGS. 1G and 1H, for example, can be associated with, or can include, a low-side transistor. In some implementations, the semiconductor die R20A, R20B shown in FIGS. 1E and 1F, for example, can be associated with, or can include, a high-side transistor. In some implementations, one or more of the semiconductor die (e.g., R20A, R20B, L20C, L20D) can be oriented in a non-flip-chip configuration or in a flip-chip configuration.

In some implementations, one or more of the leads 119A through 119E, or a portion thereof, can be bent in a different direction, at a different angle (e.g., less than 90 degrees) or with more than two points of inflection. For example, instead of being bent toward the RMOD side, one or more of the leads 119A through 119E, or a portion thereof, can be bent toward the LMOD side. In some implementations, the lead forming type could be either straight or bent with different angles based on application board design.

The components included in the submodule RMOD can be encapsulated (at least partially or completely) in a molding R120, and the components included in the submodule LMOD can be encapsulated (at least partially or completely) in a molding L120. In some implementations, the molding R120 and/or the module L120 can be an epoxy mold compound (EMC) that may be used to protect the circuits from a surrounding environment. In some implementations, the substrates HR, HL may assist with isolating and/or cooling components.

In some implementations, submodules RMOD, LMOD can be thermally coupled and/or electrically coupled via the inter-module layer INT. In some implementations, submodules RMOD, LMOD can be thermally isolated and/or electrically isolated via the inter-module layer INT. In some implementations, a gap filling material in inter-module layer INT may include, for example, a B-stage film, a gel, an epoxy, and/or so forth. In some implementations, the gap filling material in the inter-module layer INT can be a thermally insulating material and an electrically insulating material. In some implementations, one or more spacers, which are electrically conductive, can be included in the inter-module layer INT along with a gap-filling material that is a thermally insulating material and an electrically insulating material.

In some implementations, the gap filling material in the inter-module layer INT can be a thermal interface material (e.g., a thermal interface film, a thermal interface paste, a thermal interface phase-change material, etc.). The thermal interface material can be an electrically insulating material, but can be thermally conductive. In such implementations, the thermal interface material can facilitate heat transfer between, for example, the submodules RMOD, LMOD. In some implementations, one or more spacers, which are electrically conductive, can be included in the inter-module layer INT in conjunction a thermal interface material (as a gap-filling material) that is a thermally conductive material, but an electrically insulating material.

In some implementations, the inter-module layer INT can include a thermal interface material and can exclude spacers. In such implementations, the submodule RMOD and the submodule LMOD can be electrically independent, but thermally coupled. For example, heat can flow along direction Z1 (direction from substrate HR to substrate HL) from the semiconductor die R20A, through spacer RS-a, the inter-module layer INT, and spacer LS-a on side V1. Heat can flow along direction Z2 (direction from substrate HL to substrate HR and opposite direction Z1) from the semiconductor die L20C, through spacer RS-c, the inter-module layer INT, and spacer LS-c on side V2. Accordingly, the submodules RMOD, LMOD can be electrically isolated or separate submodules, but thermally coupled for dual cooling purpose between, for example, substrate HR and substrate HL.

In some implementations, the substrate HL and/or HR may be a direct bonded metal substrate (e.g., direct bonded copper (DBC) substrate). The substrates HR and/or HL can include, for example, one or more metal layers and one or more dielectric layers. In some implementations, the substrates HR and/or HL can include a dielectric disposed between a first conductor and a second conductor in a direct bonded copper (DBC) substrate. In some implementations, one or more of the metal layers of the substrate HR and/or HL can be patterned and can be configured as traces, pads, and/or so forth.

Although not shown in all implementations, one or more of the components (semiconductor die, spacers, substrates, and/or so forth) described herein may be coupled (e.g., electrically coupled, coupled in an insulating fashion) via a bonding layer, which can be, or can include, a sintered layer, a soldered layer, and/or other binding layer.

Although not shown in FIGS. 1A through 1H, in some implementations, the package 100 can include more than two submodules. For example, a first submodule can include a substrate on at least one side (e.g., an outside surface) of the first submodule. A first inter-module layer can be disposed between the first submodule and a second submodule, and a second inter-module layer can be disposed between the second submodule on a third submodule. A substrate can be included on at least one side of the third submodule. In some implementations, the second submodule can also include a substrate.

Figure 2B:
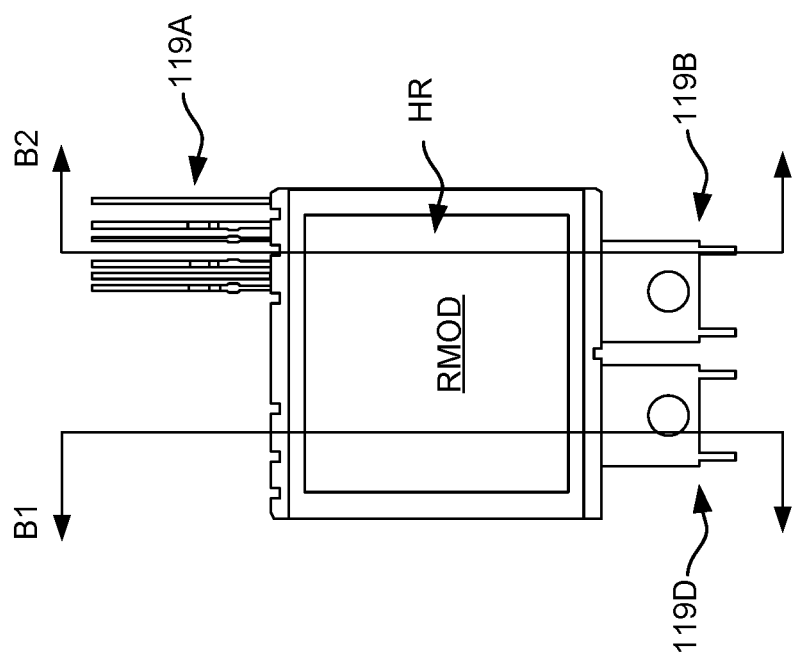
FIGS. 2A and 2B are diagrams that illustrate plan views of the components shown in FIGS. 1A through 1H in a composite stack.
Figure 2A:
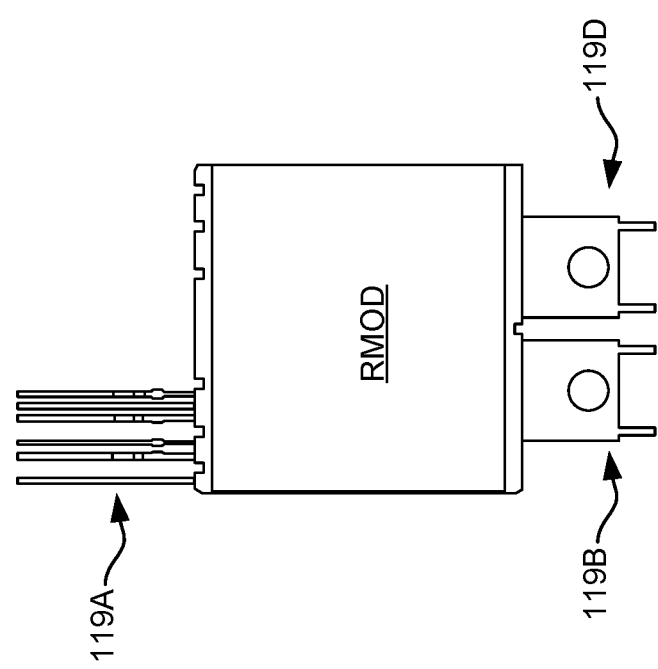

FIGS. 2A and 2B are diagrams that illustrate plan views of the submodule RMOD shown in FIGS. 1A through 1H before grinding (before exposure of spacers). FIG. 2A depicts a top view of the submodule RMOD showing a right portion of assembled package 100.

FIG. 2B depicts a bottom view of the submodule RMOD (the bottom side may be exposed outside of the package 100 when coupled with another submodule (e.g., submodule LMOD). The bottom view of the submodule RMOD illustrates that bottom surface of the substrate HR exposed through the submodule RMOD.

Here, submodule RMOD has been manufactured, assembled, molded, cleaned, and wire bonded to generate a component that can be assembled into an assembled package 100. FIGS. 2C through 2F are diagrams that illustrate various cross-sectional views of a submodule RMOD of the package 100.

Figure 2C:
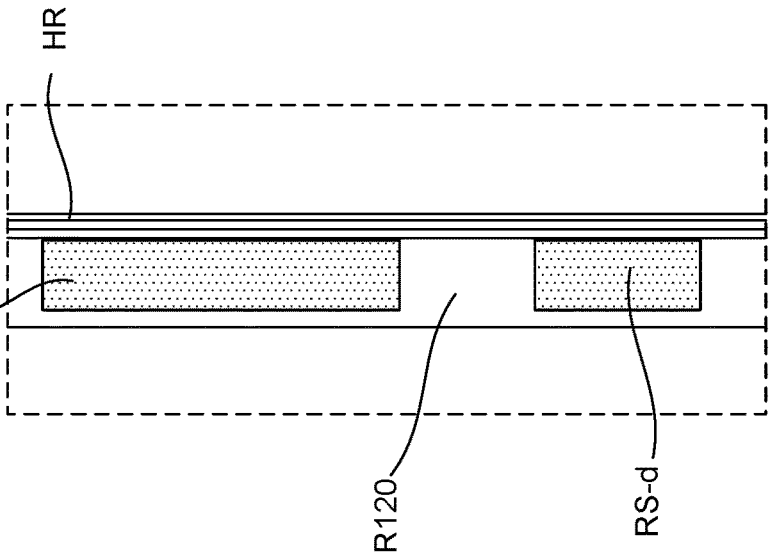
Figure 2D:
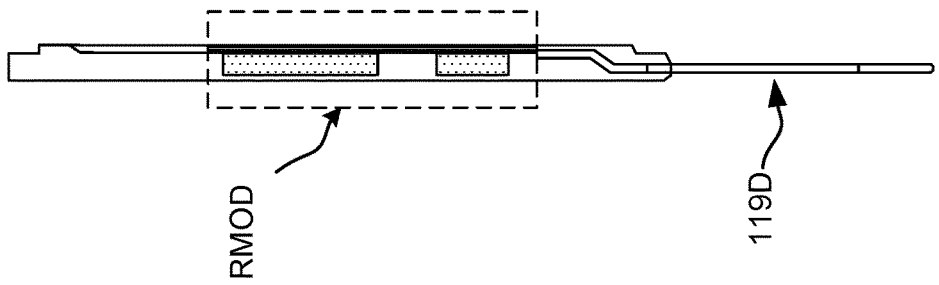

FIG. 2C is a diagram that illustrates a side cross-sectional view cut along line B1 shown in FIG. 2B. FIG. 2D illustrates a zoomed in portion (shown with dashed lines) of FIG. 2C. FIG. 2D illustrates the spacers RS-c and RS-d coupled to the substrate HR.

Figure 2F:
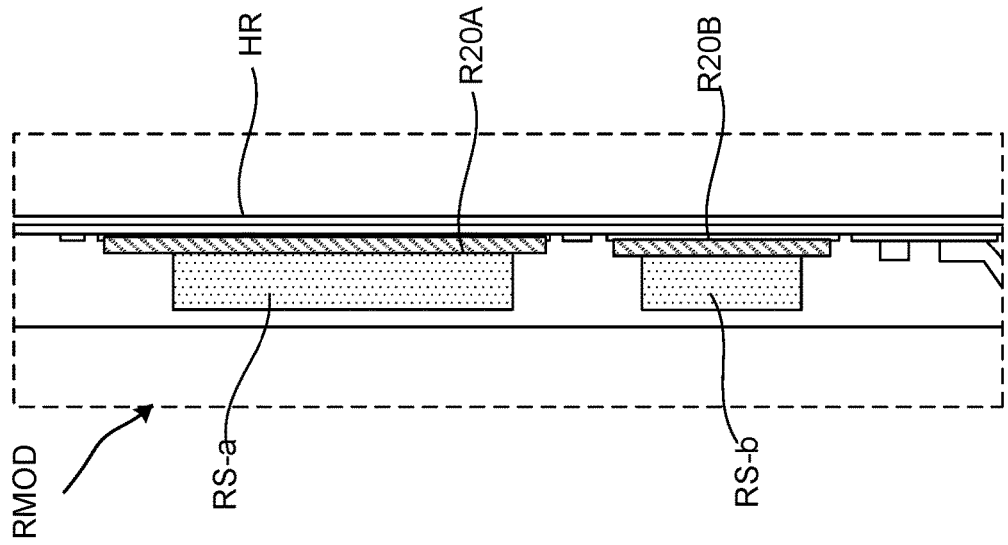
Figure 2E:
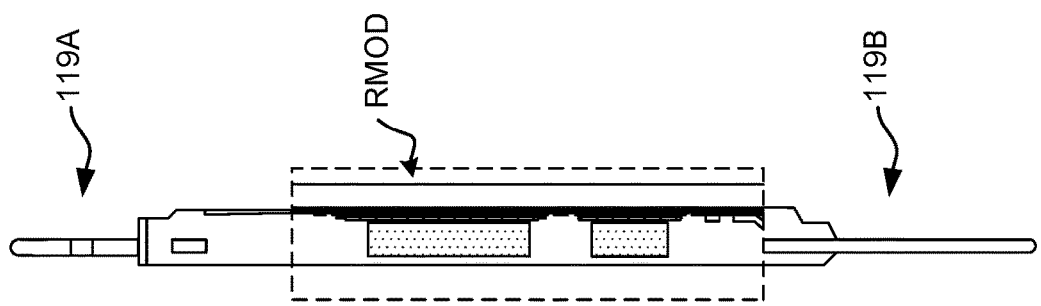

FIG. 2E is a diagram that illustrates a side cross-sectional view cut along line B2 shown in FIG. 2B. FIG. 2F illustrates a zoomed in portion (shown with dashed lines) of FIG. 2E. FIG. 2F illustrates semiconductor die the spacers RS-a and RS-b coupled to semiconductor die R20A and R20B, respectively.

Figure 3B:
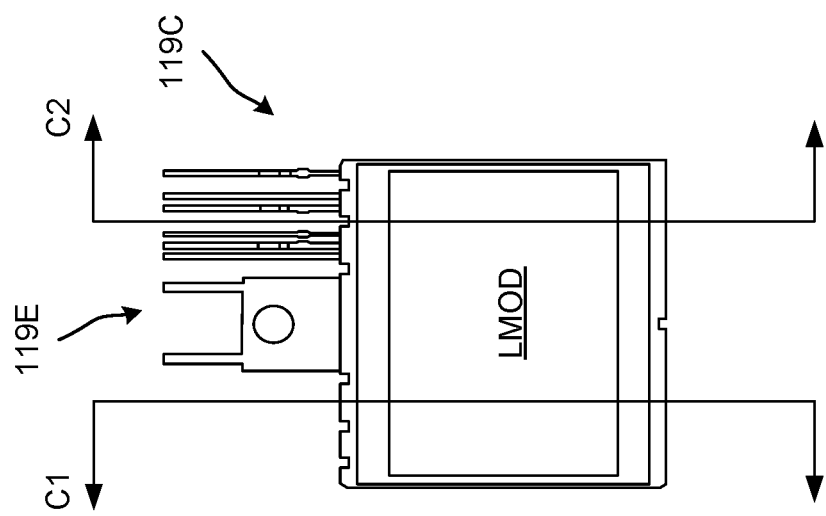
FIGS. 3A through 3F are diagrams that illustrate various views of another submodule of the package shown in FIG. 1A.
Figure 3A:
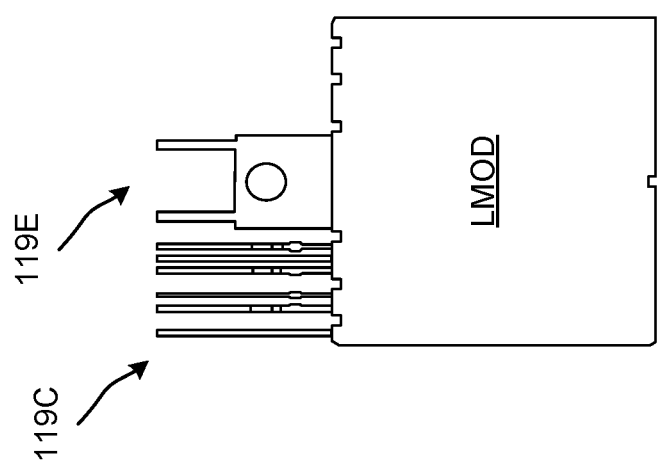

FIGS. 3A and 3B are diagrams that illustrate plan views of the submodule LMOD shown in FIGS. 1A through 1H before grinding (before exposure of spacers). FIG. 3A depicts a top view of the submodule LMOD showing a left portion of assembled package 100.

FIG. 3B depicts a bottom view of the submodule LMOD (the bottom side may be exposed outside of the package 100 when coupled with another submodule (e.g., submodule LMOD). The bottom view of the submodule LMOD illustrates that bottom surface of the substrate HR exposed through the submodule LMOD.

Here, submodule LMOD has been manufactured, assembled, molded, cleaned, and wire bonded to generate a component that can be assembled into an assembled package 100. FIGS. 3C through 3F are diagrams that illustrate various cross-sectional views of a submodule LMOD of the package 100.

Figure 3D:
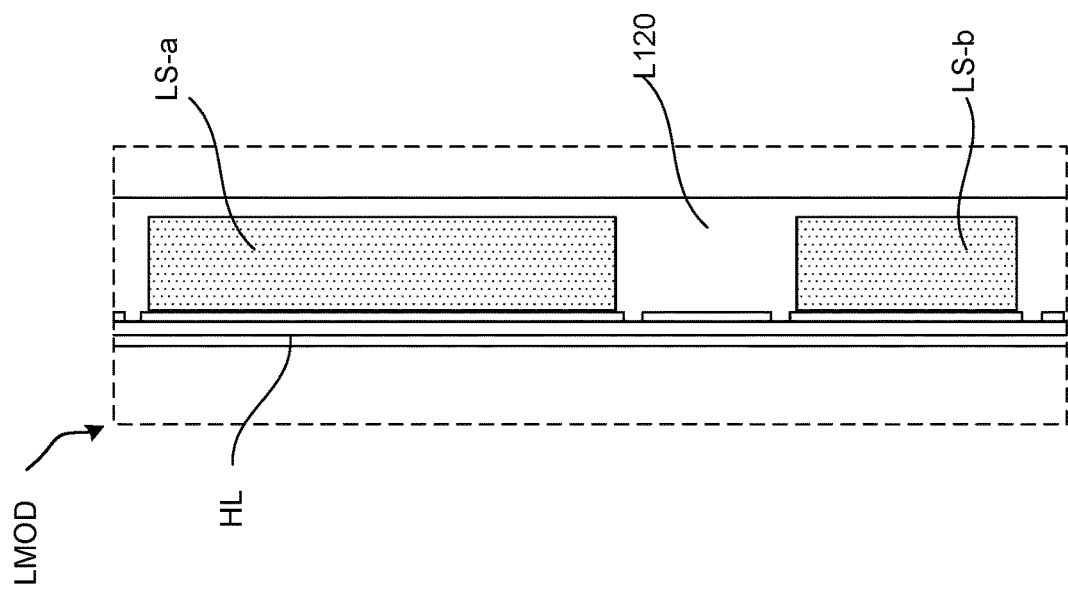
Figure 3C:
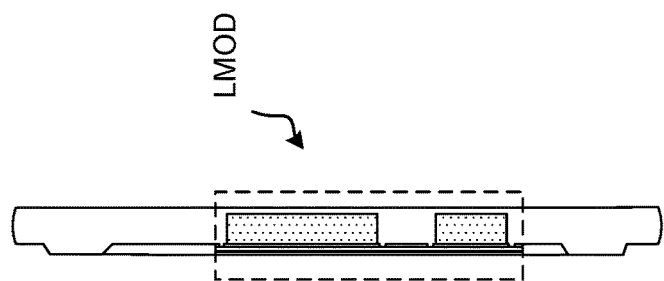

FIG. 3C is a diagram that illustrates a side cross-sectional view cut along line C1 shown in FIG. 3B. FIG. 3D illustrates a zoomed in portion (shown with dashed lines) of FIG. 3C. FIG. 3D illustrates the spacers LS-a and LS-c coupled to the substrate HL.

Figure 3F:
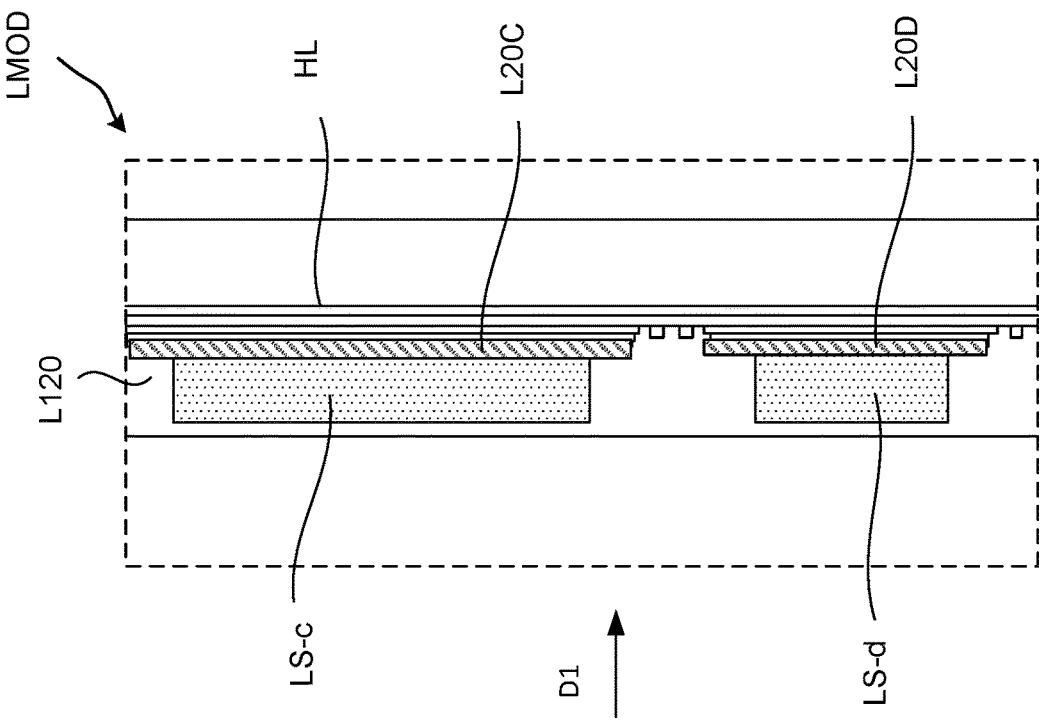
Figure 3E:
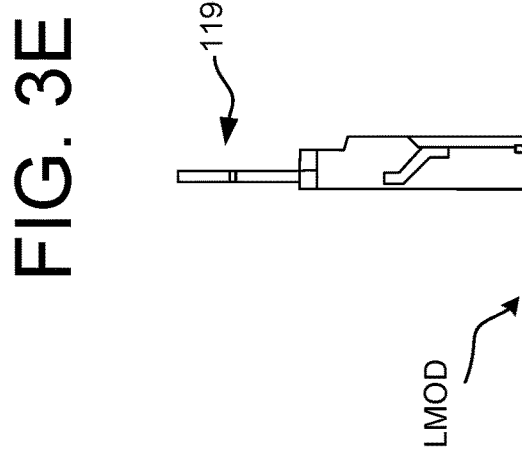

FIG. 3E is a diagram that illustrates a side cross-sectional view cut along line C2 shown in FIG. 3B. FIG. 3F illustrates a zoomed in portion (shown with dashed lines) of FIG. 3E. FIG. 3F illustrates semiconductor die the spacers LS-c and LS-d coupled to semiconductor die L20C and L20D, respectively.

FIGS. 4A through 4K are diagrams that illustrate a method of manufacturing at least a portion of the packages described herein. In this example, the process flow may pertain to a right portion (e.g., submodule RMOD) of the package 100. The method of manufacture in FIG. 4A may include defining (e.g., creating) a substrate (e.g., substrate HR) and/or patterning a layer (e.g., a metal layer) of the substrate.

Figures 4A, 4B, 4C, 4D:
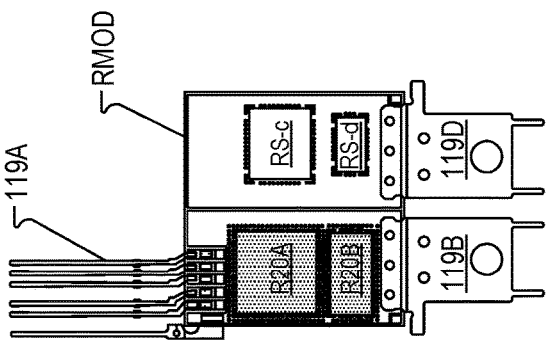

FIG. 4B illustrates screen printed a bonding layer 404 (e.g., a solder layer, a conductive epoxy layer, a sintering material) upon the substrate HR. FIG. 4C includes coupling semiconductor die R20A, R20B and spacers RS-c, RS-d onto the layer 404.

FIG. 4D illustrates coupling the leads 119A, 119B, 119D (which can be part of a leadframe) onto the submodule RMOD. The leads 119A, 119B, and 119D can be electrically coupled to one or more of the semiconductor die R20A, R20B and/or one or more of the spacers RS-c, RS-d. At FIG. 4D, a first reflow can be performed at high temperature to couple one or more of the semiconductor die R20A, R20B and/or one or more of the spacers RS-c, RS-d to the substrate HR. In addition, a first cleaning can be performed.

Figures 4E, 4F, 4G:
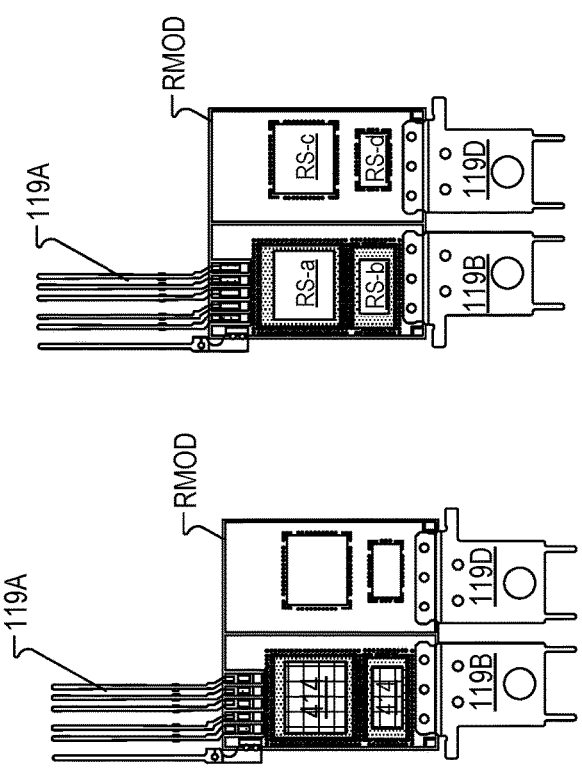
Figures 5H, 5I:
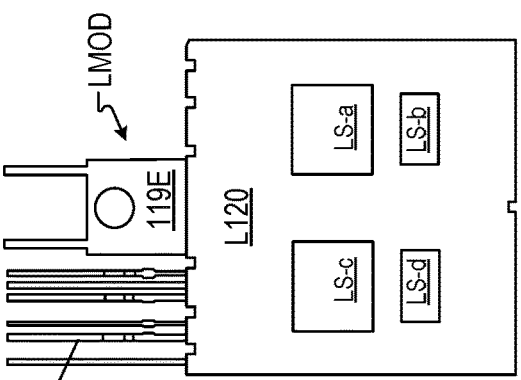
Figure 5J:
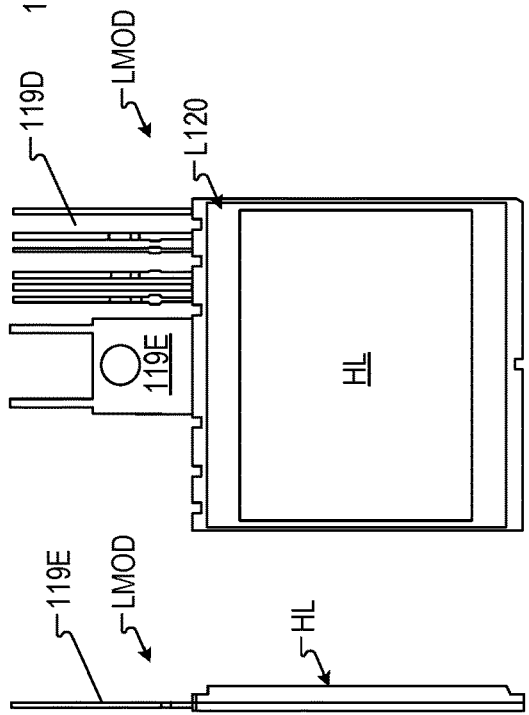
Figure 5K:
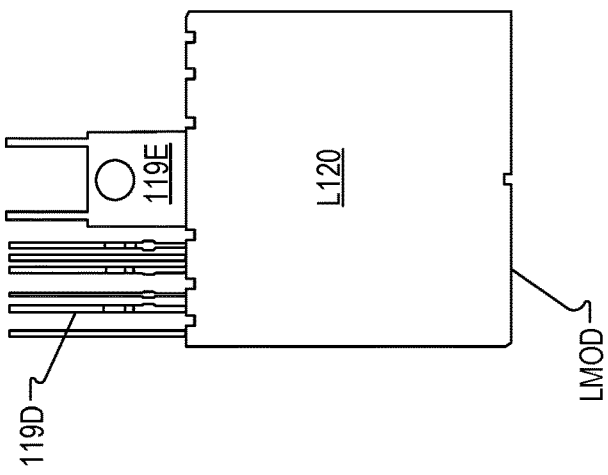

FIG. 4E illustrates includes dispensing, for example, a bonding layer 414 (e.g., a solder layer, a conductive epoxy layer, a sintering material) on the semiconductor die R20A, R20B. FIG. 4F illustrates coupling spacers RS-a and RS-b to the bonding layer 414. As shown in FIG. 4G, the spacer RS-a, which is lateral to spacer RS-c, can have a surface area approximately the same as the surface area of the spacer RS-c. Similarly, the spacer RS-b, which is lateral to spacer RS-d, can have a surface area approximately the same as the surface area of the spacer RS-d. The spacers RS-a and RS-c can have a surface area larger than the spacers RS-c and RS-d. A second reflow process may be performed at high temperature to couple one or more of the spacers RS-a, RS-b to the semiconductor die R20A, R20B.

FIG. 4G illustrates performing wire bonding to bond wire/leads within submodule RMOD. FIGS. 4H through 4J illustrate top, side, and bottom views of the submodule RMOD after being over-molded by molding R120, but before grinding. As shown in FIG. 4J, a portion of the substrate HR is exposed through the molding R120.

FIG. 4K depicts a top view after grinding the molding R120 to expose the spacers RS-a through RS-d. The grinding may be performed to obtain a predetermined thickness to expose the spacers, for example. The device can then be processed with, for example, plating and final assembly. The final assembly may be to connect (e.g., sandwich, couple) the two parts (e.g., submodules) by silver sintering/dry clamp, etc. Upon completion of connection, a gap formed between the two parts can be filled with gel, B-stage film, epoxy, or the like.

In some implementations, the submodules described herein can be compatible with a sintering process (e.g., a silver sintering process) where interfaces between components (e.g., between the leadframes and the semiconductor die) are formed using a sintered material and process. In some implementations, sintered interfaces, which can involve the coalescing of a solid material under heat and high pressure, can be desirable with the high junctions temperatures associated with silicon carbide die. Sintered interfaces can have desirable thermal performance, reliability, and/or temperature coefficients (relative to, for example, a soldered and re-flowed interface).

FIGS. 5A through 5K are diagrams that illustrate a method of manufacturing at least a portion of the packages described herein. In this example, the process flow may pertain to a left portion (e.g., submodule LMOD) of the package 100. Because the process illustrate in FIGS. 5A through 5K corresponds with the process described in connection with FIGS. 4A through 4K, the processing steps and details will not be repeated herein. It is noted, however, that the components (e.g., semiconductor die L20C, L20D and spacers LS-a through LS-d) of the submodule LMOD are included in the process flow of FIGS. 5A through 5K.

As shown in FIGS. 4A through 4K and FIGS. 5A through 5K, the orientation of the submodules is generally the same. For example, in FIGS. 4A through 4K the leads 119A coupled to the semiconductor die R20A, R20B are disposed on the left side of the substrate HR and the spacers (thick spacers) RS-c, RS-d are on the right side of the substrate HR. Similarly, in FIGS. 5A through 5K, the leads 119D coupled to the semiconductor die L20C, L20D are disposed on the left side of the substrate HL and the spacers (thick spacers) LS-a, LS-b are on the right side of the substrate HR.

Figure 6:
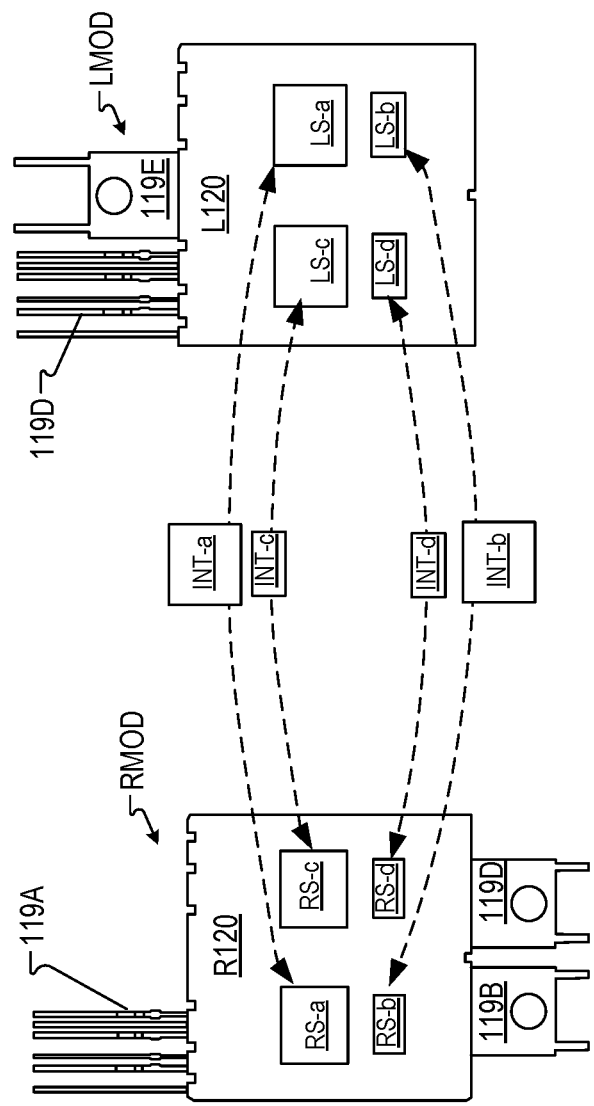
FIG. 6 is a diagram that illustrates a method of manufacturing a final assembly using the submodules described herein.

FIG. 6 is a diagram that illustrates a method of manufacturing a final assembly using the submodules RMOD and LMOD described herein. The submodule RMOD is flipped and coupled to the submodule LMOD. Specifically, the submodules RMOD and LMOD are aligned as illustrated by the dashed lines so that the spacer RS-a is aligned with the spacer LS-a, the spacer RS-b is aligned with the spacer LS-b, the spacer RS-c is aligned with the spacer LS-c, and the spacer RS-d is aligned with the spacer LS-d. In other words, the submodule spacers (LS-a through LS-d) are aligned with the submodule spacers (RS-a through RS-d).

Spacers INT-a through INT-d (which are inter-module spacers) may be included between each of the spacer pairs described above in the respective submodules RMOD, LMOD. In this implementation, four spacers INT-a through INT-d may be included between the submodules RMOD, LMOD. The spacers INT-a through INT-d can be included in the inter-module layer INT and can define a gap within the inter-module layer INT. The spacers INT-a through INT-d can be coupled initially to either the submodule RMOD or submodule LMOD.

In some implementations, one or more of the inter-module spacers described herein may be configured to electrically connect an IGBT source pad to a substrate (e.g., DBC). In some implementations, one or more of the inter-module spacers described herein may be configured to electrically connect a diode (e.g., an FRD) anode to a substrate (e.g., DBC).

FIGS. 7A through 7C illustrate various views of the package 100 after the submodules RMOD, LMOD have been coupled. FIG. 7A illustrates the substrate HR at least partially exposed and FIG. 7C illustrates the substrate HL at least partially exposed. The inter-module layer INT is illustrated in a side view of the package in FIG. 7B. After adding the spacers INT-a through INT-d and coupling the submodules RMOD, LMOD via the spacers INT-a through INT-d, a molding (e.g., a gel/epoxy) can be filled into space between the components as part of the inter-module layer INT.

FIG. 8 is a diagram that illustrates a side view of the package 100 with leads 119 that have been bent. The package 100, in some implementations can include an increased package thickness (inter-module layer INT spacing) to allow for additional cooling between the layers in the package 100.

Figures 9A, 9B:
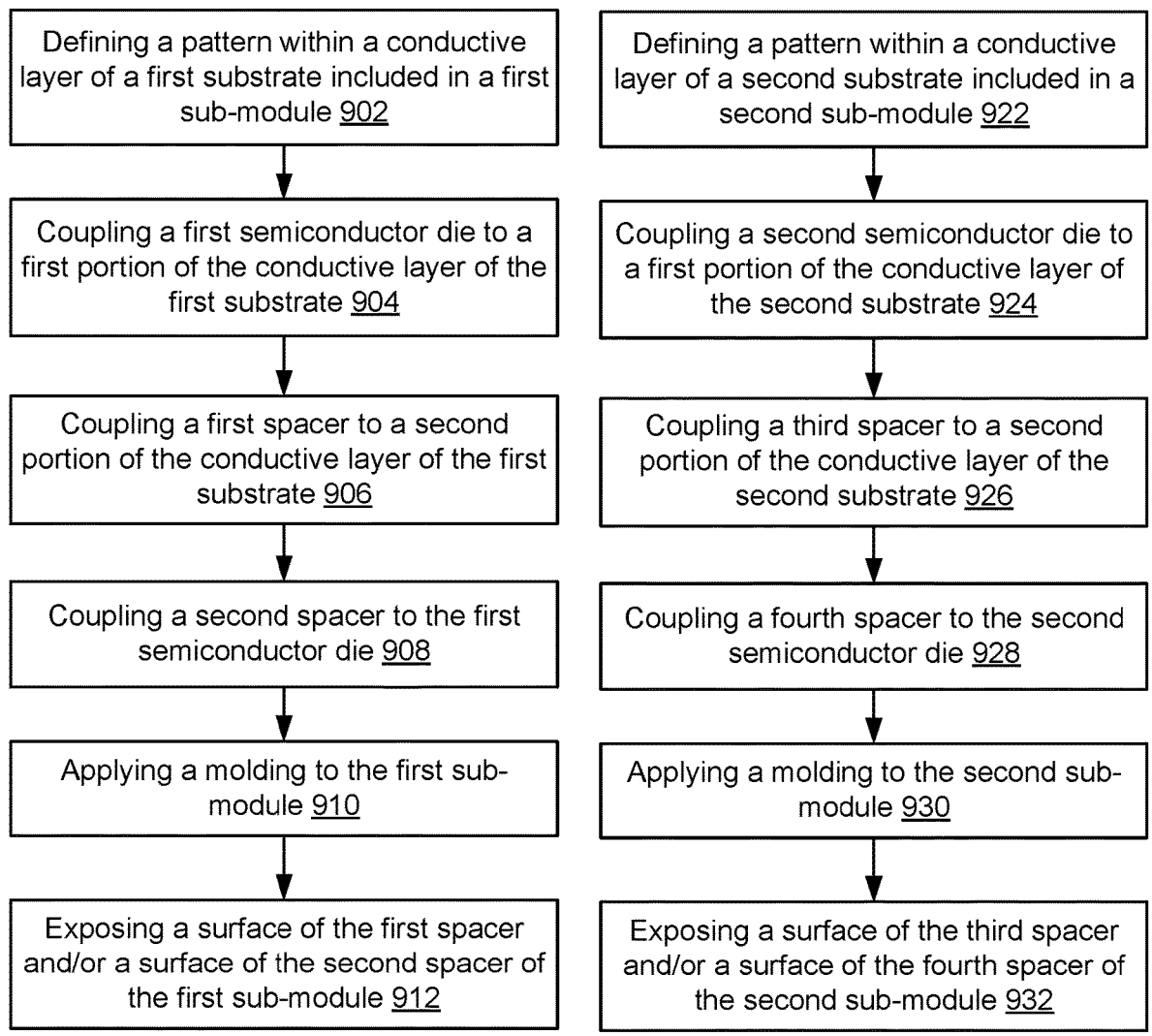
FIGS. 9A through 9C are flowcharts that collectively illustrate a method for manufacturing a semiconductor package that includes at least two submodules.
Figure 9C:
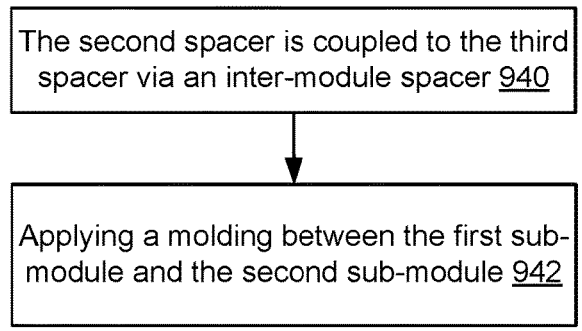

FIGS. 9A through 9C are flowcharts that collectively illustrate a method for manufacturing a semiconductor package that includes at least two submodules. In some implementations, the method can include manufacturing a plurality of submodules and coupling the submodules in a side-by-side fashion. In some implementations, a first submodule can be manufactured based on the method illustrated in FIG. 9A, and a second submodule can be manufactured based on the method illustrated in FIG. 9B. The submodules can be combined into a single package based on the method illustrated in FIG. 9C.

As shown in FIG. 9A, manufacturing a first submodule (e.g., submodule RMOD) can include defining a pattern within a conductive layer of a substrate (block 902). The pattern can be defined within the conductive layer (e.g., a metal layer) of a DBC. In some implementations, the pattern can include locations for one or more semiconductor die and/or one or more spacers.

A first semiconductor die is coupled to a first portion of the conductive layer of the substrate (block 904). The coupling can include coupling using a bonding layer (e.g., a soldering layer, a sintered material, a conductive epoxy).

A first spacer is coupled to a second portion of the conductive layer (block 906). The coupling can include coupling using a bonding layer (e.g., a soldering layer, a sintered material, a conductive epoxy). The first spacer can have a thickness greater than a thickness of the first semiconductor die.

The method can include coupling a second spacer to the first semiconductor die (block 908). The second spacer can have a thickness less than a thickness of the first spacer. The combined thickness of the second spacer and the first semiconductor die (when coupled) can be equal to (e.g., substantially equal to) a thickness of the first spacer.

Although not shown, in some implementations, one or more leads can be coupled to the conductive layer. The one or more leads can be coupled at any point between blocks 902 and 910.

A molding can be applied to the first submodule (block 910). The molding can entirely encapsulate the first spacer, the second spacer, and/or the first semiconductor die. The molding can entirely encapsulate the substrate. In some implementations, at least a portion of the substrate is left exposed. For example, a second conductive layer of the substrate (on an opposite side of the first conductive layer) can be exposed even with the molding process.

As shown in FIG. 9A, a surface of the first spacer and a surface of the second spacer of the first submodule can be exposed (block 912). In some implementations, at least a portion of the molding may be grinded away to expose the first spacer and the second spacer. In some implementations, at least a portion of the molding may be removed to provide access to any of the components of the first submodule (e.g., die and/or substrate).

FIG. 9B illustrates a method for manufacturing a second submodule. Because the processing in blocks 922 through 932 are substantially the same as those described in connection with blocks 902 through 912, the details will be not repeated. It is noted that the second submodule includes a third spacer coupled to a conductive layer of a second substrate and a fourth spacer coupled to a second semiconductor die, which is coupled to the conductive layer of the second substrate.

As shown in FIG. 9C, the first submodule can be coupled to the second submodule by coupling the second spacer to the third spacer via an inter-module spacer (block 940). Additional submodule spacers and/or inter-module spacers can be included. For example, the first spacer of the first submodule can be coupled to a fourth spacer included in the second submodule.

As shown in FIG. 9C, a molding is applied between the first submodule and the second submodule (block 942). The inter-module spacers can be encapsulated (so that they are not exposed) through the molding. The molding applied between the first submodule and the second submodule can be included in (e.g., can define) at least a part of an inter-module layer (e.g., inter-module layer INT). The inter-module spacers also be included in at least a part of an inter-module layer (e.g., inter-module layer INT).

In some implementations, the first semiconductor die can be an IGBT device and the second semiconductor die can be another IGBT device or another type of device. In some implementations, the second submodule is electrically connected to the first submodule by bonding layers (e.g., solder, etc.) to sides of the inter-module spacer. In some implementations, coupling the first submodule the second submodule results in a packaged automotive high power module (AHPM) power device.

FIGS. 10A-10C are diagrams that illustrate a tool (and components thereof) used to manufacture the final assembled package 100 described in connection with at least FIG. 6 and FIG. 9C. FIG. 10A depicts a top plate 1002, a gap supporting plate 1004a and 1004b, and a bottom plate 1006 that can be used to support the sandwiching (e.g., assembly of two or more submodules) into one package (e.g., package 100) that provides dual-sided cooling. The tool may be used to control thickness of the package 100, for example.

FIG. 10B is a top down view of the gap supporting plates 1004a and 1004b. At least some portions of an inter-module layer (e.g., inter-module spacers) are formed between or disposed within the opening 1004 (or space) between gap supporting plates 1004a and 1004b to account for the submodules being compressed and bonded (e.g., electrically bonded via solder, etc.) together, for example. Inter-module spacers, for example, can be disposed within the opening 1004 defined between the gap supporting plates 1004a and 1004b. The opening 1004 is defined by the pair of gap supporting plates 1004a and 1004b when oriented in a mirrored configuration.

In this implementation, each of the gap supporting plates 1004a and 1004b define a U-shape. In some implementations, the gap supporting plates 1004a and 1004b can have a different shape. In some implementations, each of the gap supporting plates 1004a and 1004b can have a different shape. In some implementations, each of the gap supporting plates 1004a and 1004b can have a different shape so long as an opening (e.g., opening 1004) can be defined between the gap supporting plates 1004a and 1004b.

FIG. 10C illustrates the tool of FIGS. 10A and 10B when used with submodules LMOD, RMOD. The tool includes plates 1002, 1004a and 1004b, and 1006. In addition, the submodule LMOD and submodule RMOD are shown being fitted together. The top plate 1002 can be used to support submodule RMOD and bottom plate 1006 can be used to support submodule LMOD. The gap supporting plates 1004a and 1004b can be disposed between the submodules LMOD, RMOD while being coupled (e.g., bonded) via inter-module spacers. The gap supporting plates 1004a and 1004b can have a thickness to maintain a desired spacing (e.g., vertical spacing, an inter-module spacing) (equal to the thickness of the plates 1004a, 1004b) between the submodules LMOD, RMOD while the submodules LMOD, RMOD are being coupled.

In some implementations, the gap support plates 1004a and 1004b can be removed after reflow of a bonding layer (e.g., a solder material). For example, a solder can be applied to between an inter-module spacer and a submodule spacer included in and exposed on a surface of a first submodule. A solder can also be applied between the inter-module spacer and a submodule spacer included in and exposed on a surface of a second submodule. Inter-module spacer can be disposed within the opening 1004 in the gap support plates 1004a and 1004b while the gap support plates 1004a and 1004b are disposed between the first and second submodules. After reflow of the solder on each side of the inter-module spacer, the gap support plates 1004a and 1004b can be removed. A molding can be disposed in the gap between the first and second submodules after the gap support plates 1004a and 1004b have been removed.

Figure 11:
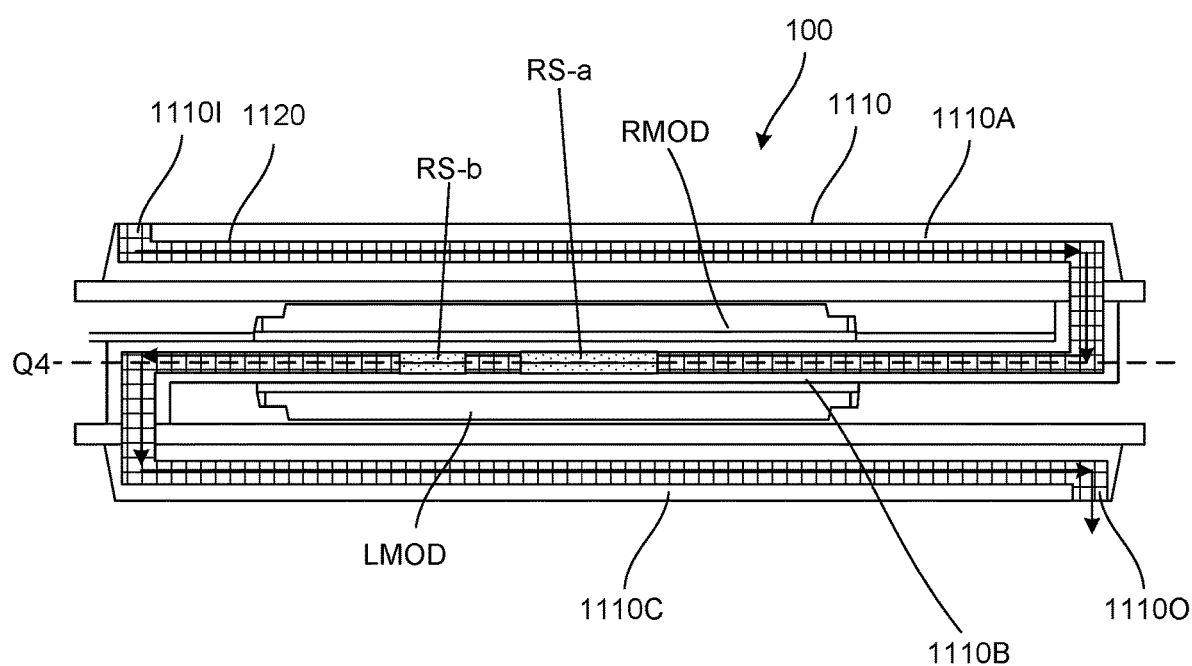
FIG. 11 is a diagram that illustrates cooling configuration for the packages described herein.

FIG. 11 is a diagram that illustrates cooling (e.g., heat removal) configuration variation for the packages described herein. As shown in FIG. 11, dual-sided cooling may be performed on the components within the package 100. As shown in FIG. 11, a cooling jacket 1110 may be coupled around each submodule (submodule LMOD and RMOD in this example). Specifically, a first portion 1110A of the cooling jacket 1110 is coupled to an outside surface (e.g., an exposed substrate surface) of the submodule RMOD, a second portion 1110B of the cooling jacket 1110 is disposed between the submodules RMOD, LMOD, and a third portion 1110B of the cooling jacket 1110 is coupled to an outside surface (e.g., an exposed substrate surface) of the submodule RMOD. The second portion 1110B of the cooling jacket 1110 is coupled to an inner surface of the submodule RMOD and the submodule LMOD. The second portion 1110B of the cooling jacket 1110 is included in the package where the inter-module layer would be included (as described above). In this implementation, the first portion 1110A, the second portion 1110B, and the third portion 1110C are aligned parallel to one another. As shown in FIG. 11, inter-module spacers RS-a, RS-b are included in the package 100. As shown in FIG. 11, the cooling jacket 1110 defines a lumen 1120 therethrough. Accordingly, a fluid (e.g., cooling liquid, water, air, etc.) can be moved through the lumen 1120. The fluid can be used to cool the various surfaces of the package 100. For example, when the fluid moves through the first portion 1110A of the cooling jacket 1110, the outside surface of the submodule RMOD can be cooled. Arrows within the lumen 1120 are used to illustrate fluid flow direction. In some implementations, the fluid flow direction can be different than shown in FIG. 11.

In some implementations, the cooling jacket 1110 can be modified from that shown in FIG. 11. For example, in some implementations, the cooling jacket 1110 can include multiple separate portions. As a specific example, the first portion 1110A can be separate from the second portion 1110B. In such implementations, the first portion 1110A can define a first lumen separate from a second lumen defined by the second portion 1110B. A first fluid can be moved through the first lumen of the first portion 1110A and a second fluid can be moved through the second lumen of the second portion 1110B.

In some implementations, the cooling jacket 1110 can include more or less portions than shown in FIG. 11. In some implementations, the lumen 1120 within the cooling jacket 1110 can define a curved channel rather than a channel with abrupt orthogonal angles. As shown in FIG. 11, the inlet portion 1110I (and inlet opening) of the lumen 1120 and the outlet portion 1110O (and outlet opening) of the lumen 1120 are orthogonal to the portions 1110A, 1110B. In some implementations, the inlet portion 1110I and/or the outlet portion 1110O can be aligned with one or more of the portions 1110A, 1110B.

Figure 12:
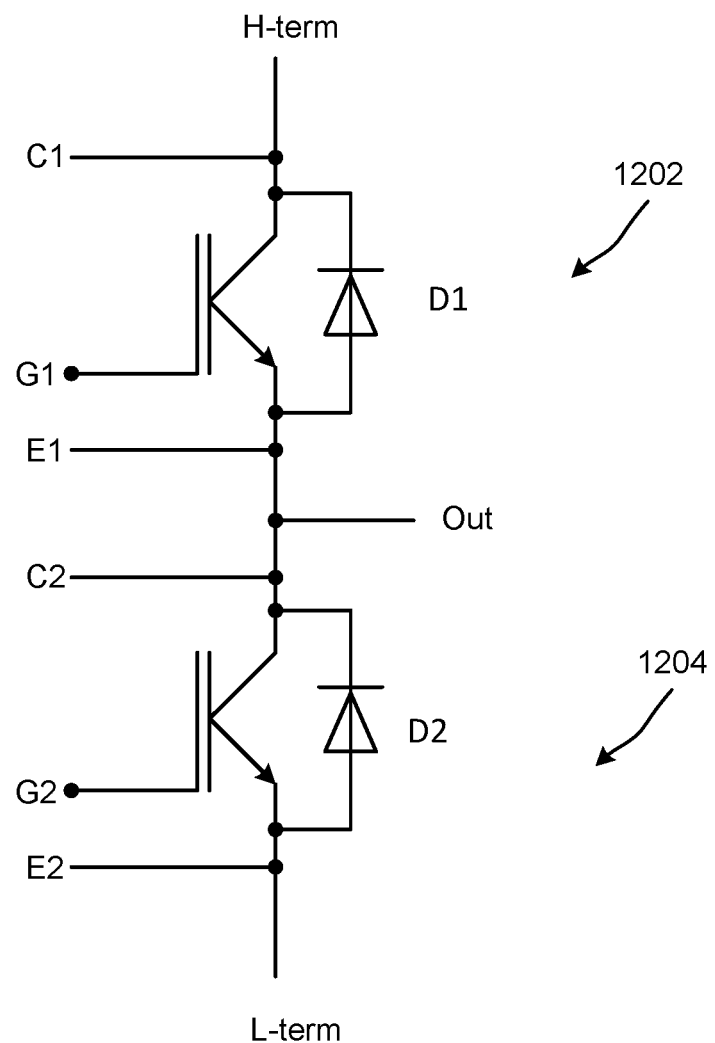
FIG. 12 is a diagram that illustrates an example circuit configuration that can be implemented using the packages described herein.

In some implementations, the package 100 shown in FIG. 11 can include a thermal interface material. In some implementations, for example, the thermal interface material can be disposed between the submodules RMOD, LMOD, and can be included around at least a portion of the cooling jacket 1110. Although not shown in FIG. 11, in some implementations, spacers (e.g., spacers RS-a, RS-b) can be excluded from the package 100. In such implementations, the submodules RMOD, LMOD can be electrically isolated, but thermally coupled via the cooling jacket 1110 and the thermal interface material. FIG. 12 is a diagram that illustrates an example circuit configuration 1200 that can be implemented using the submodules (and packages) described herein. The circuit is a current half bridge AHPM. As shown in FIG. 12, the circuit includes a high-side device (e.g., P-type Device (Device P)) and a low-side device (e.g., an N-type Device (Device N)). The source Collectors (C1 and C2), the gates (G1 and G2), the Emitters (E1 and E2), and Diodes (D1 and D2) of each of the devices is labeled in FIG. 12. The high-side terminal (H-term), the low-side terminal (L-term), and the output terminal Out are shown in FIG. 12. Each of the devices (e.g., Device P, Device N) can be defined within a submodule.

The circuit 1200 shown in FIG. 12 can be implemented, for example, in the submodules described herein. The terminals H-term, L-term, Out of the circuit 1200 can correspond with the leads 119B, 119D, and 119E. The side of the device associated with the low-side terminal can be referred to as a low side of the device, and the side of the device associated with the high-side terminal can be referred to as a high side of the device. In operation of circuit 1200, a load may be applied to induce a voltage to drive IGBT 1202 and IGBT 1204.

Figure 13:
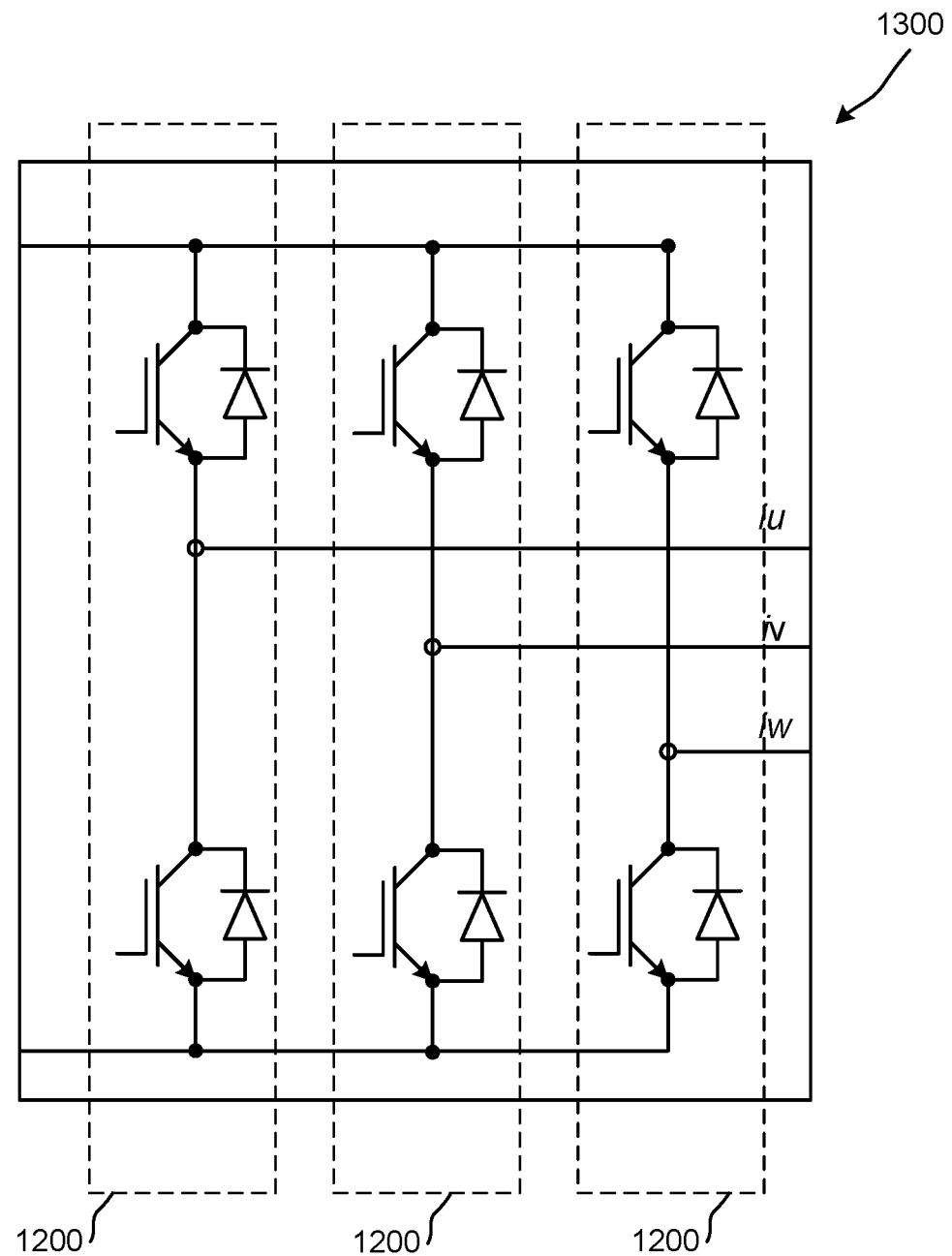
FIG. 13 is a diagram that illustrates an example circuit configuration that can be implemented using the packages described herein.

FIG. 13 is a diagram that illustrates an example circuit configuration 1300 that can be implemented using the submodules described herein. Here, three AHPM circuits 1200 may be stacked to produce a power gate drive device for any of the applications described herein. The circuit configuration 1300 may include three integrated half-bridge drivers to produce three currents $i_u$, $i_v$, and $i_w$.

In one general aspect, a package can include a first submodule including a first semiconductor die coupled to a first substrate and a first spacer, and disposed between the first spacer and the first substrate. The first submodule can include a second spacer disposed lateral to the first semiconductor die. The package can include a second submodule including a second semiconductor die coupled to a second substrate and a third spacer, and disposed between the third spacer and the second substrate. The second submodule an include a fourth spacer disposed lateral to the second semiconductor die. The package can include an inter-module layer disposed between the first submodule and the second submodule, and the first spacer of the first submodule can be electrically coupled to the fourth spacer of the second submodule via the inter-module layer. The second spacer of the first submodule can be electrically coupled to the third spacer of the second submodule via the inter-module layer.

In some implementations, the inter-module layer is aligned along a horizontal plane between the second spacer and the fourth spacer. In some implementations, from the first submodule side of the package to the second submodule side of the package, the first semiconductor die, the first spacer, the inter-module layer, and the fourth spacer define a first vertical stack. From the first submodule side of the package to the second submodule side of the package, the second spacer, the inter-module layer, the third spacer, and the second semiconductor die define a second vertical stack.

In some implementations, the first semiconductor die, the first spacer, the inter-module layer, and the fourth spacer define a first vertical stack. The second submodule side of the package, the second spacer, the inter-module layer, the third spacer, and the second semiconductor die can define a second vertical stack. The first vertical stack can define an order of components flipped relative to an order of components in the second vertical stack.

In some implementations, the first substrate, the second substrate, and the inter-module layer are configured to provide thermal cooling to a plurality of components included in the first submodule and the second submodule. In some implementations, the first semiconductor die is a first portion of an automotive high power module (AHPM) power device, and the second semiconductor die is a second portion of the automotive high power module (AHPM) power device.

In some implementations, the first semiconductor die is coupled to a first lead extending from the first submodule and the second semiconductor die is coupled to a second lead extending from the second submodule. The first lead and the second lead can extend from opposite sides of the inter-module layer. In some implementations, the first submodule is aligned parallel to the second submodule. In some implementations, the first semiconductor die includes at least one insulated-gate bipolar transistor device and at least one fast recovery diode. In some implementations, the first semiconductor die and the first spacer have a combined thickness substantially equal to a thickness of the second spacer.

In another general aspect, a package can include a first submodule including a first semiconductor die coupled to a first substrate and disposed between a first spacer and the first substrate, and a second spacer coupled to the first substrate. The second spacer can have a thickness substantially equal to a combined thickness of the first semiconductor die when coupled to the first spacer. The package can include a second submodule including a second semiconductor die coupled to a second substrate and disposed between a third spacer and the second substrate, and a fourth spacer coupled to the second substrate. The package can include an inter-module layer disposed between the first submodule and the second submodule. The inter-module layer can be aligned along a horizontal plane, and the first semiconductor die can be aligned within a first vertical stack parallel to a second vertical stack including the second semiconductor die.

In some implementations, the inter-module layer is disposed between the first submodule and the second submodule. The first substrate can be on a first side and the inter-module layer and the second substrate is disposed on a second side of the inter-module layer. The first substrate can define at least a portion of a first outside surface of the package, and the second substrate can define at least a portion of a second outside surface of the package.

In some implementations, the inter-module layer is configured to provide a common thermal cooling surface for the first submodule and the second submodule. In some implementations, the package can also include a cooling jacket defining a lumen and including a portion coupled to the first submodule and a portion coupled to the second submodule.

In yet another general aspect, a method of forming a package can include for a first submodule coupling a semiconductor die to a first portion of a pattern of a conductive layer of a substrate, coupling a first spacer to a second portion of the conductive layer of the substrate, coupling a second spacer to the semiconductor die, applying a molding to the first submodule, and exposing a surface of at least the first spacer of the first submodule. The method can also include for a second submodule exposing a surface of at least a third spacer of the second submodule, and coupling the second spacer to the third spacer via an inter-module spacer.

In some implementations, the substrate is a first substrate, the third spacer of the second submodule is coupled to a second substrate of the second submodule without an intervening semiconductor die. In some implementations, the semiconductor die is a first semiconductor die, the substrate is a first substrate, the inter-module spacer is a first inter-module spacer. The method can also include for the second submodule coupling a second semiconductor die to a conductive layer of a second substrate, coupling the first spacer to the conductive layer of the second substrate, coupling a fourth spacer to the second semiconductor die, exposing a surface of at least the third spacer of the second submodule through a molding, and coupling the fourth spacer of the second submodule to the first spacer of the first submodule via a second inter-module spacer.

In some implementations, the method can include applying a molding between the first submodule and the second submodule after the coupling via the inter-module spacer. In some implementations, the second spacer to the third spacer via an inter-module spacer includes clamping the first submodule to the second submodule. In some implementations, the coupling the second spacer to the third spacer via an inter-module spacer including coupling using a tool including a gap supporting plate.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Implementations may be implemented in a computing system that includes a back end component, e.g., as a data server, or that includes a middleware component, e.g., an application server, or that includes a front end component, e.g., a client computer having a graphical user interface or a Web browser through which a user can interact with an implementation, or any combination of such back end, middleware, or front end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A package, comprising:
   a first submodule including:
      a first substrate;
      a first semiconductor die coupled to the first substrate;
      a first spacer coupled to the first semiconductor die, the first semiconductor die being disposed between the first spacer and the first substrate; and
      a second spacer coupled to the first substrate and disposed lateral to the first semiconductor die;
   a second submodule including:
      a second substrate;
      a second semiconductor die coupled to the second substrate;
      a third spacer coupled to the second semiconductor die, the second semiconductor die being disposed between the third spacer and the second substrate; and
      a fourth spacer coupled to the second substrate and disposed lateral to the second semiconductor die; and
   an inter-module layer disposed between the first submodule and the second submodule,
   the first spacer being electrically coupled to the fourth spacer via the inter-module layer,
   the first semiconductor die, the first spacer and the fourth spacer being linearly aligned in the package in a first stacked arrangement,
   the second spacer being electrically coupled to the third spacer via the inter-module layer, and
   the second semiconductor die, the third spacer and the second spacer being linearly aligned in the package in a second stacked arrangement.

2. The package of claim 1, wherein the inter-module layer is aligned along a horizontal plane between the second spacer and the fourth spacer.

3. The package of claim 1, wherein:
   from a first submodule side of the package to a second submodule side of the package, the first semiconductor die, the first spacer, the inter-module layer, and the fourth spacer define a first, linearly-aligned vertical stack, and
   from the first submodule side of the package to the second submodule side of the package, the second spacer, the inter-module layer, the third spacer, and the second semiconductor die define a second, linearly aligned vertical stack.

4. The package of claim 1, wherein:
   the first semiconductor die, the first spacer, the inter-module layer, and the fourth spacer define a first vertical stack,
   the second spacer, the inter-module layer, the third spacer, and the second semiconductor die define a second vertical stack, and
   in the package, the first vertical stack defines an order of components flipped relative to an order of components in the second vertical stack.

5. The package of claim 1, wherein the first substrate, the second substrate, and the inter-module layer are configured to provide thermal cooling to a plurality of components included in the first submodule and the second submodule.

6. The package of claim 1, wherein the inter-module layer includes:
- a fifth spacer disposed between the first spacer and the fourth spacer, the fifth spacer being vertically aligned with the first semiconductor die, the first spacer, and the fourth spacer; and
- a sixth spacer disposed between the second spacer and the third spacer, the sixth spacer being vertically aligned with the second semiconductor die, the second spacer, and the third spacer.

7. The package of claim 6, wherein the inter-module layer includes a thermally conductive layer thermally coupling the first submodule with the second submodule,
the fifth spacer and the sixth spacer being disposed in the thermally conductive layer and defining respective gaps in the thermally conductive layer.

8. The package of claim 7, wherein the thermally conductive layer includes a thermally conductive fill material disposed between the first submodule and the second submodule.

9. The package of claim 7, wherein the thermally conductive layer includes a cooling jacket.

10. The package of claim 7, wherein the thermally conductive layer electrically insulates the first submodule from the second submodule.

11. The package of claim 1, wherein the first submodule is aligned parallel to the second submodule.

12. The package of claim 1, wherein the first semiconductor die and the first spacer have a combined thickness substantially equal to a thickness of the second spacer.

13. A package, comprising:
- a first submodule including:
  - a first substrate;
  - a semiconductor die coupled to the first substrate; and
  - a first spacer coupled to the semiconductor die, the semiconductor die being disposed between the first spacer and the first substrate;
- a second submodule including:
  - a second substrate; and
  - a second spacer coupled to the second substrate; and
- an inter-module layer disposed between the first submodule and the second submodule, the inter-module layer including:
  - a thermally conductive layer thermally coupling the first submodule with the second submodule; and
  - a third spacer disposed in the thermally conductive layer and defining a gaps in the thermally conductive layer,
the first spacer being electrically coupled to the second spacer via the third spacer,
the semiconductor die, the first spacer, the third spacer and the second spacer being linearly aligned in the package in a stacked arrangement.

14. The package of claim 13, wherein the first substrate is disposed on a first side of the inter-module layer and the second substrate is disposed on a second side of the inter-module layer, the first substrate defining at least a portion of a first outside surface of the package, the second substrate defining at least a portion of a second outside surface of the package.

15. The package of claim 13, wherein the thermally conductive layer includes a fill material disposed between the first submodule and the second submodule.

16. The package of claim 13, wherein the thermally conductive layer includes a cooling jacket defining a lumen, the cooling jacket including a first surface coupled to the first submodule and a second surface coupled to the second submodule.

17. The package of claim 13, wherein the thermally conductive layer electrically insulates the first submodule from the second submodule.

* * * * *